United States Patent
Li et al.

(10) Patent No.: US 11,756,330 B2
(45) Date of Patent: *Sep. 12, 2023

(54) BIOMETRIC SENSOR, DISPLAY APPARATUS, AND METHOD FOR DETECTING BIOMETRIC INFORMATION

(71) Applicant: BOE Technology Group Co., Ltd., Beijing (CN)

(72) Inventors: Changfeng Li, Beijing (CN); Haisheng Wang, Beijing (CN); Xiaochuan Chen, Beijing (CN); Lei Wang, Beijing (CN); Yingming Liu, Beijing (CN); Xueyou Cao, Beijing (CN); Yunke Qin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,101

(22) Filed: May 16, 2022

(65) Prior Publication Data

US 2022/0270393 A1 Aug. 25, 2022

Related U.S. Application Data

(63) Continuation-in-part of application No. 16/495,034, filed as application No. PCT/CN2019/076849 on Mar. 4, 2019, now Pat. No. 11,361,578.

(30) Foreign Application Priority Data

Sep. 29, 2018 (CN) .......................... 201811151381.8

(51) Int. Cl.
*G06K 9/00* (2022.01)
*G06V 40/13* (2022.01)
(Continued)

(52) U.S. Cl.
CPC ........ *G06V 40/1318* (2022.01); *G06F 3/0412* (2013.01); *G06F 3/0446* (2019.05);
(Continued)

(58) Field of Classification Search
CPC ............. G06V 40/1318; G06V 10/141; G06V 10/145; G06F 3/0446; G06F 3/0412; G06F 3/0416; H01L 27/3276
(Continued)

(56) References Cited

U.S. PATENT DOCUMENTS

2007/0046625 A1* 3/2007 Yee ...................... G06F 3/0416
345/156
2009/0021487 A1 1/2009 Tien
(Continued)

FOREIGN PATENT DOCUMENTS

CN 101587256 A 11/2009
CN 106250834 A 12/2016
(Continued)

OTHER PUBLICATIONS

First Office Action in the Chinese Patent Application No. 201811151381. 8, dated Apr. 30, 2020; English translation attached.
(Continued)

*Primary Examiner* — Abdul-Samad A Adediran
(74) *Attorney, Agent, or Firm* — Intellectual Valley Law, P.C.

(57) ABSTRACT

A biometric sensor configured to detect a biometric information is provided. The biometric sensor includes a light emitting layer and a touch detection layer; an encapsulating cover on the light emitting layer; a photo-sensing layer configured to detect at least a portion of a light totally reflected by a surface of the biometric sensor in touch with a skin of a user; a touch sensing circuit configured to determine a touch position of a touch; a processor config-
(Continued)

ured to determine a scanning region based on the touch position, and configured to control the light emitting layer to form a scanning light source to scan the scanning region in a scanning pattern; and a biometric information analysis circuit configured to determine a light intensity distribution of a reflected light reflected by the surface of the biometric sensor, and configured to determine the biometric information based on the light intensity distribution.

18 Claims, 8 Drawing Sheets

(51) Int. Cl.
  *G06V 10/145* (2022.01)
  *G06F 3/044* (2006.01)
  *G06F 3/041* (2006.01)
  *G06V 10/141* (2022.01)
  *H10K 59/131* (2023.01)

(52) U.S. Cl.
  CPC .......... *G06V 10/141* (2022.01); *G06V 10/145* (2022.01); *H10K 59/131* (2023.02)

(58) Field of Classification Search
  USPC ........................................ 345/156
  See application file for complete search history.

(56) References Cited

U.S. PATENT DOCUMENTS

| | | |
|---|---|---|
| 2009/0289910 A1 | 11/2009 | Hattori |
| 2010/0007632 A1 | 1/2010 | Yamazaki |
| 2011/0221707 A1 | 9/2011 | Oyobe et al. |
| 2013/0044082 A1 | 2/2013 | Lin et al. |
| 2016/0378225 A1 | 12/2016 | Wang et al. |
| 2017/0147865 A1* | 5/2017 | Jensen ................. G06V 10/141 |
| 2017/0161538 A1 | 6/2017 | Liu et al. |
| 2017/0372113 A1 | 12/2017 | Zhang et al. |
| 2018/0089491 A1* | 3/2018 | Kim ...................... G06F 3/0412 |
| 2018/0113548 A1 | 4/2018 | Lee et al. |
| 2018/0239943 A1 | 8/2018 | Xu et al. |

FOREIGN PATENT DOCUMENTS

| | | |
|---|---|---|
| CN | 106326845 A | 1/2017 |
| CN | 107025451 A | 8/2017 |
| CN | 107832752 A | 3/2018 |
| CN | 107977105 A | 5/2018 |
| CN | 108256409 A | 7/2018 |
| CN | 108598117 A | 9/2018 |
| JP | 2017010507 A | 1/2017 |
| WO | 2010055710 A1 | 5/2010 |

OTHER PUBLICATIONS

Second Office Action in the Chinese Patent Application No. 201811151381.8, dated Jan. 28, 2021; English translation attached.
Non-Final Office Action in the U.S. Appl. No. 16/495,034, dated Nov. 16, 2021.
Response to Non-Final Office Action in the U.S. Appl. No. 16/495,034, dated Jan. 5, 2022.
Notice of Allowance in the U.S. Appl. No. 16/495,034, dated Feb. 16, 2022.
International Search Report & Written Opinion dated Jul. 4, 2019, regarding PCT/CN2019/076849.
The Extended European Search Report in the European Patent Application No. 19864131.8, dated Jun. 1, 2022.
First Office Action in the Japanese Patent Application No. 2020563913, dated Apr. 10, 2023; English translation attached.

* cited by examiner

BIOMETRIC SENSOR, DISPLAY APPARATUS, AND METHOD FOR DETECTING BIOMETRIC INFORMATION

CROSS-REFERENCE TO RELATED APPLICATION

This application is a continuation-in-part of U.S. application Ser. No. 16/495,034, filed Mar. 4, 2019, which is a national stage application under 35 U.S.C. § 371 of International Application No. PCT/CN2019/076849, filed Mar. 4, 2019, which claims priority to Chinese Patent Application No. 201811151381.8, filed Sep. 29, 2018. Each of the forgoing applications is herein incorporated by reference in its entirety for all purposes.

TECHNICAL FIELD

The present invention relates to biometric information detection technology and display technology, more particularly, to a biometric sensor, a display apparatus, and a method for detecting a biometric information.

BACKGROUND

Nowadays, more and more electronic devices are equipped with functions of detecting biometric information. Especially for the fingerprint recognition technology, it is the most widely used and the cheapest technology among various biometric technologies, due to its uniqueness and stability.

SUMMARY

In one aspect, the present invention provides a biometric sensor configured to detect a biometric information, comprising a base substrate; a light emitting layer and a touch detection layer on the base substrate; an encapsulating cover on a side of the light emitting layer away from the base substrate; a photo-sensing layer between the light emitting layer and the base substrate, and comprising a plurality of photosensors configured to detect at least a portion of a light totally reflected by a surface of the biometric sensor in touch with a skin of a user; a touch sensing circuit configured to determine a touch position of a touch; a processor configured to determine a scanning region based on the touch position, and configured to control the light emitting layer to form a scanning light source to scan the scanning region in a scanning pattern, the scanning region encompassing the touch position; and a biometric information analysis circuit configured to determine a light intensity distribution of a reflected light reflected by the surface of the biometric sensor in touch with the skin of the user based on signals from the plurality of photosensors, and configured to determine the biometric information based on the light intensity distribution.

Optionally, the scanning pattern comprises linear scanning lines.

Optionally, the light emitting layer comprises an array of a plurality of light emitting elements; a plurality of thin film transistors respectively driving light emission of the plurality of light emitting elements; a plurality of data lines; and a plurality of gate lines; wherein a respective one of the plurality of data lines is electrically connected to source electrodes of thin film transistors in a column of the plurality of thin film transistors; a respective one of the plurality of gate lines is electrically connected to gate electrodes of thin film transistors in a row of the plurality of thin film transistors; drain electrodes of the plurality of thin film transistors are respectively electrically connected to the plurality of light emitting elements; and the processor is configured to control turning on or off the plurality of thin film transistors respectively through the plurality of gate lines, and configured to control transmission of data signals to the plurality of light emitting elements respectively through the plurality of data lines.

Optionally, the processor is configured to control multiple consecutive data lines extending through the scanning region to simultaneously transmit data signals to sources electrodes of multiple columns of thin film transistors in the scanning region, and configured to turn on multiple rows of thin film transistors in the scanning region, through multiple consecutive gate lines, thereby forming a first linear scanning light source limited in the scanning region to scan the scanning region along a column direction.

Optionally, the processor is further configured to simultaneously turn on multiple consecutive rows of thin film transistors in the scanning region through multiple consecutive gate lines, and configured to control multiple consecutive data lines extending through the scanning region to transmit data signals to sources electrodes of multiple columns of thin film transistors in the scanning region thereby forming a second linear scanning light source limited in the scanning region to scan the scanning region along a row direction.

Optionally, the processor is further configured to control the light emitting layer to form the scanning light source in a time-division mode comprising a first scanning mode, and a second scanning mode; the first scanning mode comprises a plurality of first scanning periods; the second scanning mode comprises a plurality of second scanning periods; and the plurality of first scanning periods and the plurality of second scanning periods are alternately arranged; in the first scanning mode, the processor is configured to control multiple consecutive data lines extending through the scanning region to simultaneously transmit data signals to sources electrodes of multiple columns of thin film transistors in the scanning region, and configured to turn on multiple rows of thin film transistors in the scanning region through multiple consecutive gate lines in the plurality of first scanning periods in a first sequential order, thereby forming a first linear scanning light source limited in the scanning region to scan the scanning region along a column direction; and in the second scanning mode, the processor is further configured to simultaneously turn on multiple consecutive rows of thin film transistors in the scanning region through multiple consecutive gate lines, and configured to control multiple consecutive data lines extending through the scanning region to transmit data signals to sources electrodes of multiple columns of thin film transistors in the scanning region in the plurality of second scanning periods in a second sequential order thereby forming a second linear scanning light source limited in the scanning region to scan the scanning region along a row direction.

Optionally, the processor is configured to control multiple light emitting elements limited in the scanning region to time-sequentially forming a plurality of point light sources consecutively arranged, one of the plurality of point light sources turning on at a time while a remainder of the plurality of point light sources turned off, thereby forming the scanning pattern comprising linear scanning lines; wherein a respective one of the plurality of point light sources comprises one or multiple adjacent light emitting elements.

Optionally, the scanning pattern comprises a continuous folded line comprising a plurality of linear lines parallel to each other.

Optionally, the touch detection layer is on a side of the encapsulating cover away from the base substrate.

Optionally, the touch detection layer is between the encapsulating cover and the light emitting layer.

Optionally, the touch detection layer is between the light emitting layer and the photo-sensing layer.

Optionally, the touch detection layer comprises a plurality of self-capacitive touch electrodes.

Optionally, the touch detection layer comprises a plurality of touch scanning electrode and a plurality of touch sensing electrodes intersecting each other.

In another aspect, the present invention provides a method for detecting a biometric information, comprising providing a biometric sensor comprising a base substrate, a light emitting layer and a touch detection layer on the base substrate, an encapsulating cover on a side of the light emitting layer away from the base substrate, and a photo-sensing layer between the light emitting layer and the base substrate; determining a touch position of a touch by a touch sensing circuit; determining a scanning region based on the touch position; controlling the light emitting layer to form a scanning light source to scan the scanning region in a scanning pattern, the scanning region encompassing the touch position; detecting at least a portion of a light totally reflected by a surface of the biometric sensor in touch with a skin of a user by a plurality of photosensors in the photo-sensing layer; determining a light intensity distribution of a reflected light reflected by the surface of the biometric sensor in touch with the skin of the user based on signals from the plurality of photosensors; and determining the biometric information based on the light intensity distribution.

Optionally, the scanning pattern comprises linear scanning lines.

Optionally, the light emitting layer comprises an array of a plurality of light emitting elements; a plurality of thin film transistors respectively driving light emission of the plurality of light emitting elements; a plurality of data lines; and a plurality of gate lines; wherein a respective one of the plurality of data lines is electrically connected to source electrodes of thin film transistors in a column of the plurality of thin film transistors; a respective one of the plurality of gate lines is electrically connected to gate electrodes of thin film transistors in a row of the plurality of thin film transistors; and drain electrodes of the plurality of thin film transistors are respectively electrically connected to the plurality of light emitting elements; and wherein the method further comprises turning on or off the plurality of thin film transistors respectively through the plurality of gate lines, and controlling transmission of data signals to the plurality of light emitting elements respectively through the plurality of data lines; wherein controlling the light emitting layer to form the scanning light source comprises controlling multiple consecutive data lines extending through the scanning region to simultaneously transmit data signals to sources electrodes of multiple columns of thin film transistors in the scanning region, and turning on multiple rows of thin film transistors in the scanning region through multiple consecutive gate lines in a first sequential order, thereby forming a first linear scanning light source limited in the scanning region to scan the scanning region along a column direction.

Optionally, the light emitting layer comprises an array of a plurality of light emitting elements; a plurality of thin film transistors respectively driving light emission of the plurality of light emitting elements; a plurality of data lines; and a plurality of gate lines; wherein a respective one of the plurality of data lines is electrically connected to source electrodes of thin film transistors in a column of the plurality of thin film transistors; a respective one of the plurality of gate lines is electrically connected to gate electrodes of thin film transistors in a row of the plurality of thin film transistors; and drain electrodes of the plurality of thin film transistors are respectively electrically connected to the plurality of light emitting elements; wherein the method further comprises turning on or off the plurality of thin film transistors respectively through the plurality of gate lines, and controlling transmission of data signals to the plurality of light emitting elements respectively through the plurality of data lines; wherein controlling the light emitting layer to form the scanning light source comprises simultaneously turning on multiple consecutive rows of thin film transistors in the scanning region through multiple consecutive gate lines; and controlling multiple consecutive data lines extending through the scanning region to transmit data signals to sources electrodes of multiple columns of thin film transistors in the scanning region in a second sequential order, thereby forming a second linear scanning light source limited in the scanning region to scan the scanning region along a row direction.

Optionally, the light emitting layer comprises an array of a plurality of light emitting elements; a plurality of thin film transistors respectively driving light emission of the plurality of light emitting elements; a plurality of data lines; and a plurality of gate lines; wherein a respective one of the plurality of data lines is electrically connected to source electrodes of thin film transistors in a column of the plurality of thin film transistors; a respective one of the plurality of gate lines is electrically connected to gate electrodes of thin film transistors in a row of the plurality of thin film transistors; and drain electrodes of the plurality of thin film transistors are respectively electrically connected to the plurality of light emitting elements; wherein the method further comprises turning on or off the plurality of thin film transistors respectively through the plurality of gate lines, and controlling transmission of data signals to the plurality of light emitting elements respectively through the plurality of data lines, in a time-division mode comprising a first scanning mode and a second scanning mode; the first scanning mode comprises a plurality of first scanning periods; the second scanning mode comprises a plurality of second scanning periods; and the plurality of first scanning periods and the plurality of second scanning periods are alternately arranged; wherein controlling the light emitting layer to form the scanning light source in the first scanning mode comprises controlling multiple consecutive data lines extending through the scanning region to simultaneously transmit data signals to sources electrodes of multiple columns of thin film transistors in the scanning region, and turning on multiple rows of thin film transistors in the scanning region through multiple consecutive gate lines in the plurality of first scanning periods in a first sequential order, thereby forming a first linear scanning light source limited in the scanning region to scan the scanning region along a column direction; wherein controlling the light emitting layer to form the scanning light source in the second scanning mode comprises simultaneously turning on multiple consecutive rows of thin film transistors in the scanning region through multiple consecutive gate lines; and controlling multiple consecutive data lines extending through the scanning region to transmit data signals to sources electrodes of multiple columns of thin film transistors in the scanning region in the plurality of second scanning periods in a second sequential order, thereby forming a second linear scanning light source limited in the scanning region to scan the scanning region along a row direction.

Optionally, the light emitting layer comprises an array of a plurality of light emitting elements; a plurality of thin film transistors respectively driving light emission of the plurality of light emitting elements; a plurality of data lines; and a plurality of gate lines; wherein a respective one of the plurality of data lines is electrically connected to source electrodes of thin film transistors in a column of the plurality of thin film transistors; a respective one of the plurality of gate lines is electrically connected to gate electrodes of thin film transistors in a row of the plurality of thin film transistors; and drain electrodes of the plurality of thin film transistors are respectively electrically connected to the plurality of light emitting elements; wherein the method further comprises turning on or off the plurality of thin film transistors respectively through the plurality of gate lines, and controlling transmission of data signals to the plurality of light emitting elements respectively through the plurality of data lines; wherein controlling the light emitting layer to form the scanning light source comprises controlling multiple light emitting elements limited in the scanning region to time-sequentially forming a plurality of point light sources consecutively arranged, one of the plurality of point light sources turning on at a time while a remainder of the plurality of point light sources turned off, thereby forming the scanning pattern comprising linear scanning lines; wherein a respective one of the plurality of point light sources comprises one or multiple adjacent light emitting elements.

Optionally, the scanning pattern comprises a continuous folded line comprising a plurality of linear lines parallel to each other.

In another aspect, the present invention provides a display apparatus, comprising the biometric sensor described herein or fabricated by a method described herein, and one or more integrated circuits connected to the biometric sensor.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
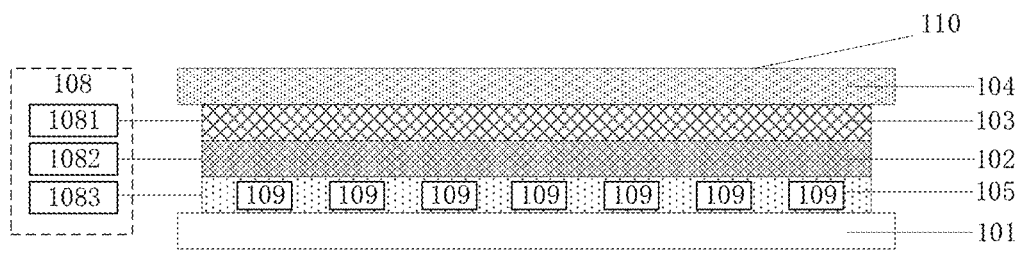
FIG. 1 is a schematic diagram of a structure of a biometric sensor in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Screen fingerprint readers generally include silicon-based sensors. A wafer of a silicon-based sensor have a certain size. To increase the size of the silicon-based wafer, the cost may increase exponentially. Therefore, by using the silicon-based sensor, it is difficult to perform the fingerprint recognition on a large-size screen. Moreover, in order for the silicon-based sensor to better detect a fingerprint, a collimated film is typically used to filter out stray light. The collimated film is relatively thicker, e.g. in a range of approximately 100 µm to approximately 500 µm, leading to a thicker display panel. The collimated film should be aligned with the silicon-based sensor. The alignment process is complicated and limits the production capacity of a display panel having a silicon-based sensor.

Accordingly, the present disclosure provides, inter alia, a method for detecting a biometric information, a biometric sensor, and a display apparatus that substantially obviate one or more of the problems due to limitations and disadvantages of the related art. In one aspect, the present disclosure provides a method for detecting a biometric information. In some embodiments, the method for detecting a biometric information includes providing a biometric sensor including a base substrate, a light emitting layer and a touch detection layer on the base substrate, an encapsulating cover on a side of the light emitting layer away from the base substrate, and a photo-sensing layer between the light emitting layer and the base substrate; determining a touch position of a touch by a touch sensing circuit; determining a scanning region based on the touch position; controlling the light emitting layer to form a scanning light source to scan the scanning region in a scanning pattern including linear scanning lines, the scanning region encompassing the touch position; detecting at least a portion of a light totally reflected by a surface of the biometric sensor in touch with a skin of a user by a plurality of photosensors in the photo-sensing layer; determining a light intensity distribution of a reflected light reflected by the surface of the biometric sensor in touch with the skin of the user based on signals from the plurality of photosensors; and determining the biometric information based on the light intensity distribution.

In another aspect, the present disclosure also provides a biometric sensor configured to detect a biometric information. In some embodiments, the biometric sensor includes a base substrate; a light emitting layer and a touch detection layer on the base substrate; an encapsulating cover on a side of the light emitting layer away from the base substrate; a photo-sensing layer between the light emitting layer and the base substrate, and including a plurality of photosensors configured to detect at least a portion of a light totally reflected by a surface of the biometric sensor in touch with a skin of a user; a touch sensing circuit configured to determine a touch position of a touch; a processor configured to determine a scanning region based on the touch position, and configured to control the light emitting layer to form a scanning light source to scan the scanning region in a scanning pattern including linear scanning lines, the scanning region encompassing the touch position; and a biometric information analysis circuit configured to determine a light intensity distribution of a reflected light reflected by the surface of the biometric sensor in touch with the skin of the user based on signals from the plurality of photosensors, and configured to determine the biometric information based on the light intensity distribution.

FIG. 1 is a schematic diagram of a structure of a biometric sensor in some embodiments according to the present disclosure. Referring to FIG. 1, in some embodiments, a biometric sensor includes a base substrate 101, a light emitting layer 102 and a touch detection layer 103 on a side of the base substrate 101, an encapsulating cover 104 on a side of the light emitting layer 102 away from the base substrate 101, a photo-sensing layer 105 between the base substrate 101 and the light emitting layer 102.

In some embodiments, the biometric sensor includes a touch sensing circuit 1081, a processor 1802, and a biometric information analysis circuit 1083. Optionally, the touch sensing circuit 1081 is connected with the touch detection layer 103. Optionally, the processor 1802 is connected with the light emitting layer 102. Optionally the biometric information analysis circuit 1803 is connected with the photo-sensing layer 105.

In some embodiments, the biometric sensor includes a controller 108. Optionally, the controller 108 is an integrated circuit including the touch sensing circuit 1081, the processor 1082, and the biometric information analysis circuit 1083.

In some embodiments, the touch sensing circuit 1081 is configured to determine a touch position of a touch. The processor 1802 is configured to determine a scanning region based on the touch position, and configured to control the light emitting layer 102 to form a scanning light source to scan the scanning region in a scanning pattern including linear scanning lines. Optionally, the scanning region encompasses the touch position.

In some embodiments, the photo-sensing layer 105 includes a plurality of photosensors 109 configured to detect at least a portion of a light totally reflected by a surface 110 of the biometric sensor facing away the base substrate 101 (e.g., a surface of the biometric sensor in touch with a skin of a user). Optionally, the plurality of photosensors 109 is configured to collect signals about a portion of a light totally reflected by a surface 110 of the biometric sensor facing away the base substrate 101 (e.g., the surface of the biometric sensor in touch with the skin of the user), and to send the signals to the biometric information analysis circuit 1083.

In some embodiment, the biometric information analysis circuit 1083 is configured to determine a light intensity distribution of a reflected light reflected by the surface 110 of the biometric sensor facing away the base substrate 101 based on signals from the plurality of photosensors 109. Optionally, the biometric information analysis circuit 1083 is configured to determine the biometric information based on the light intensity distribution. For example, based on the light intensity distribution, a pattern of valleys and ridges of a fingerprint is determined.

In some embodiments, the scanning light source can be formed in any region of the light emitting layer 102, and the photo-sensing layer 105 can detect at least a portion of a light totally reflected by a surface 110 of the biometric sensor facing away the base substrate 101. The collaboration between the light emitting layer 102 and the photo-sensing layer 105 allows the fingerprint recognition to be performed in any region of the surface 110 of the biometric sensor away from the base substrate. In some embodiments, the photo-sensing layer 105 may be formed using a semiconductor lithographic process. The methods of forming the photo-sensing layer 105 is simple, and it is easy to form an apparatus in larger size using the methods of forming the photo-sensing layer 105 herein. In some embodiments, a portion of the light emitted from the scanning light source of the light emitting layer 102 is totally reflected by the surface 110 of the biometric sensor facing away the base substrate 101. The totally reflected light is transmitted toward the photo-sensing layer 105, which may exclude the adversary influence of stray light, so no collimating film is required to filter the stray light. Without having a collimating film in a biometric sensor, the thickness of the biometric sensor is decreased, which may enhance the competitiveness of the product having the biometric sensor without a collimating film.

Figure 2:
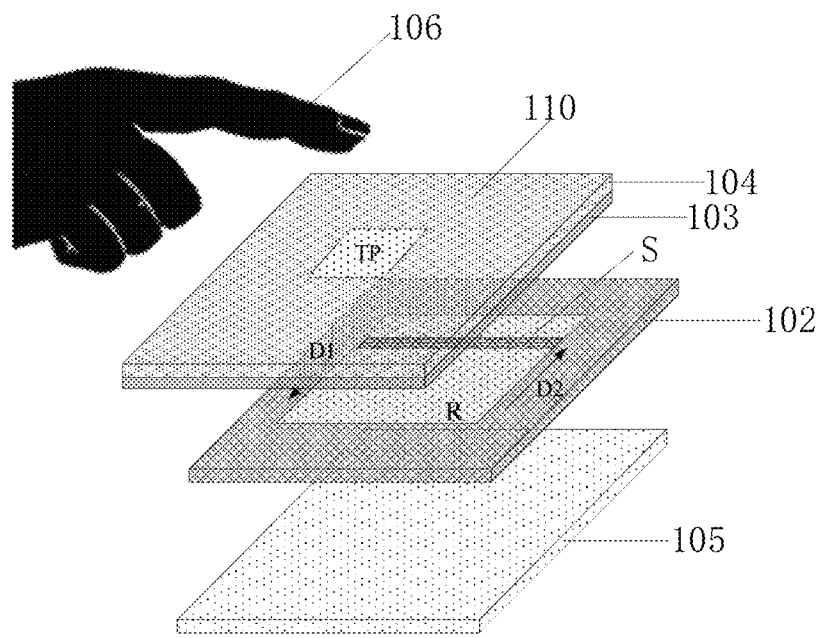
FIG. 2 is a schematic diagram of a three-dimensional structure of a biometric sensor in some embodiments according to the present disclosure.

FIG. 2 is a schematic diagram of a three-dimensional structure of a biometric sensor in some embodiments according to the present disclosure. Referring to FIG. 2, when a finger 106 is pressing on the surface 110 of the biometric sensor facing away the base substrate 101, the touch sensing circuit may determine a touch position TP of a touch of the finger 106 using signals detected by the touch detection layer 103. An instruction is generated and output by the touch sensing circuit to processor. The processor determines a scanning region R based on the touch position TP, and controls the light emitting layer 102 to form a scanning light source S to scan the scanning region R. Optionally, the surface 110 of the biometric sensor facing away the base substrate 101 is a surface of the encapsulating cover 104 facing away from the base substrate 101. Optionally, the light source S scans the scanning region R in a scanning pattern including linear scanning lines.

Optionally, the scanning region R encompasses the touch position TP. The touch position TP detected by the touch detection layer 103 is represented by a coordinate or multiple coordinates. The size of the scanning region R is decided based on the touch position TP.

Various appropriate sizes of the scanning region R may be used according to different situations. In one example, in order to collect more information of fingerprint, the scanning region R has an area larger than an area of a contacting area (e.g. touch position) between the finger 106 and the encapsulating cover 104. For example, an orthographic projection of the scanning region R on the base substrate 101 covers an orthographic projection of the contracting area (e.g. touch position) between the finger 106 and the encapsulating cover 104. In another example, in order to prevent light from being transmitted out from an edge of the finger 106, the scanning region R has an area smaller than the area of the contacting area (e.g. touch position) between the finger 106 and the encapsulating cover 104. For example, the orthographic projection of the contracting area (e.g. touch position) between the finger 106 and the encapsulating cover 104 covers the orthographic projection of the scanning region R on the base substrate 101.

Various appropriate shapes may be used for forming a scanning region R. Examples of shapes suitable for a scanning region R include, but are not limited to, circular shape, rectangular shape, and elliptical shape. In one example, an orthographic projection of the touch position TP on scanning region R is on the center of the scanning region R, or covers the center of the scanning region R. Optionally, the scanning region R has a square shape with 1 cm width, and the center of the square shape corresponds to the touch position. In another example, the orthographic projection of the touch position TP on scanning region R deviates from a geometric center of the scanning region R.

Various appropriate shapes may be used to form a scanning light source. For example, referring to FIG. 2, the scanning light source S formed by the light emitting layer 102 is a linear scanning line. Optionally, the scanning light source S moves along a direction D1 and a direction D2.

Figure 3A:
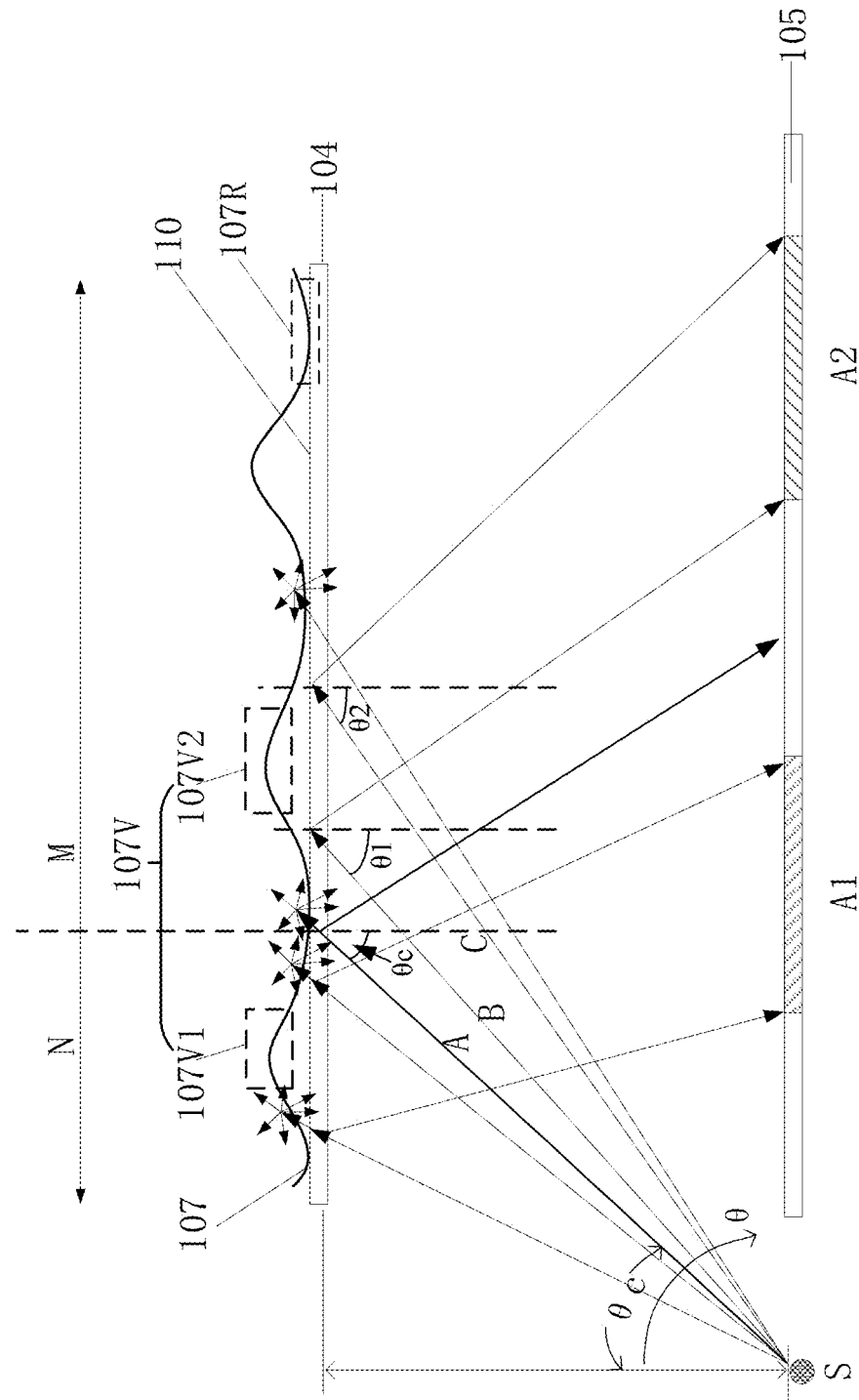
FIG. 3A is a schematic diagram illustrating a path of light irradiated from a scanning light source toward a surface of the biometric sensor in some embodiments according to the present disclosure.

FIG. 3A is a schematic diagram illustrating a path of light emitted from a scanning light source toward a surface 110 of the biometric sensor in some embodiments according to the present disclosure. Referring to FIG. 3A, a refractive index of the surface 110 of the biometric sensor away from the base substrate 101 is greater than a refractive index of air. Optionally, the surface 110 of the biometric sensor away from the base substrate 101 is the surface of the encapsulating cover 104 away from the base substrate 101. A refractive index of the surface of the encapsulating cover 104 away from the base substrate 101 is greater than the refractive index of air. For example, the encapsulating cover 104 is made of glass. A refractive index of glass is approximately 1.5, the refractive index of air is approximately 1.0.

For example, light emitted from the scanning light source S is transmitted to the surface 110 of the biometric sensor away from the base substrate 101, a portion of light has an incident angle greater than a critical angle $\theta c$. Light having an incident angle $\theta$ towards the surface 110 of the biometric sensor greater than the critical angle $\theta c$ will be totally reflected by the surface 110 of the biometric sensor.

Referring to FIG. 3A, an incident angle $\theta$ of light A towards the surface 110 of the biometric sensor away from the base substrate 101 is equivalent to the critical angle $\theta c$. An incident angle $\theta 1$ of light B towards the surface 110 of the biometric sensor is greater than the critical angle $\theta c$. An incident angle $\theta 2$ of light C towards the surface 110 of the biometric sensor is also greater than the critical angle $\theta c$. The light B and the light C can be totally reflected by the surface 110 of the biometric sensor away from the base substrate 101.

In some embodiment, the light transmitted to the region M of the surface 110 of the biometric sensor away from the base substrate 101 has incident angles greater than the critical angle $\theta c$. Since light having the incident angles greater than the critical angle $\theta c$ can be totally reflected, the light transmitted to the region M of the surface 110 having an incident angle $\theta$ greater than the critical angle $\theta c$ can be totally reflected. Light transmitted to the region N of the surface 110 of the biometric sensor away from the base substrate 101 has an incident angle $\theta$ smaller than the critical angle $\theta c$. Since light having an incident angle $\theta$ smaller than the critical angle $\theta c$ can be refracted out of the biometric sensor, the light transmitted to the region N of the surface 110 of the biometric sensor away from the base substrate 101 having incident angles $\theta$ smaller than the critical angle $\theta c$ can be refracted out of the biometric sensor.

In one example, the surface 110 of the biometric sensor away from the base substrate 101 is not pressed by a finger, light having incident angle $\theta$ greater than the critical angle $\theta c$ can be totally reflected to the photo-sensing layer 105. The light having incidental angle $\theta$ smaller than the critical angle $\theta c$ will be refracted out of the surface 110 of the biometric sensor away from the base substrate 101.

In another example, the surface 110 of the biometric sensor away from the base substrate 101 is pressed by a finger 106 having fingerprint 107. The fingerprint 107 includes a plurality of valleys 107V and a plurality of ridges 107R. In FIG. 3A, portions of fingerprint 107 receding away from the base substrate 101 are the plurality of valleys 107V, and portions of fingerprint 107 protruding along a direction towards the base substrate 101 are the plurality of ridge 107R.

A plurality of ridges 107R of the fingerprint 107 are in direct contact with the surface 110 of the biometric sensor. A space is between the respective one of a plurality of valleys 107V of the fingerprint 107 and the surface 110 of the biometric sensor. The respective one of the plurality of valleys 107V of the fingerprint 107 will not affect the total reflection of the light having incident angle $\theta$ greater than the critical incident angel $\theta c$. However, total reflection conditions in these regions are locally disrupted in regions corresponding to the plurality of ridges 107R of the fingerprint 107, since the light no longer transmits from a surface 110 of biometric sensor to air (e.g. from a media having higher refractive index to another media having lower refractive index). When light irradiates on the surface 110 of biometric sensor, diffused reflection occurs on the interface, thereby generating a diffused reflected light transmitting along various directions. The light transmitted out of the surface 110 of the biometric sensor may be absorbed by the finger 106.

In some embodiments, light is totally reflected by parts of region M corresponding to the plurality of valleys 107V of the fingerprint 107. The light totally reflected is transmitted to the photo-sensing layer 105. In one example, a part of region M corresponding to a second valley 107V2 of the plurality of valleys 107V may totally reflect approximately 100% of the light transmitted to the part of region M corresponding to the second valley 107V2. The light totally reflected by the part of region M corresponding to a second valley 107V2 is transmitted to A2 region of the photo-sensing layer 105. The light intensity in A2 region is strong.

In some embodiments, a region in direct contact with A2 region in the photo-sensing layer 105 corresponds to a respective one of the plurality of ridges 107R, since the condition for total reflection is destroyed, most light transmitting towards parts of region M corresponding to the plurality of ridges 107R will be refracted out from parts of region M corresponding to the plurality of ridges 107R. A small portion of light will be reflected back by parts of region M corresponding to the plurality of ridges 107R to the photo-sensing layer 105. Accordingly, the region in direct contact with A2 region in the photo-sensing layer 105 corresponds to a respective one of the plurality of ridges 107R has a light intensity weaker than the light intensity in A2 region.

In some embodiments, the plurality of photosensors 109 of the photo-sensing layer 105 detect at least a portion of a light totally reflected by a surface 110 of the biometric sensor facing away the base substrate 101 (e.g., a surface of the biometric sensor in touch with a skin of a user), and send signals to the biometric information analysis circuit 1083. Optionally, the signals can be photocurrent signals. The greater the light intensity is, the larger the photocurrent is obtained. In one example, based on the photocurrent signals sent by the plurality of photosensors 109, the biometric information analysis circuits 1803 determines a light intensity distribution of a light reflected by the surface 110 of the biometric sensor facing away the base substrate 101 (e.g., the surface of the biometric sensor in touch with the skin of the user). By data analysis and image processing, a pattern of a plurality of valleys 107V and a plurality of ridges 107R of the fingerprint 107 is obtained. For example, a portion of the light intensity distribution having weak light intensity corresponds to the plurality of ridges 107R of the fingerprint 107. A portion of the light intensity distribution having strong light intensity corresponds to the plurality of valleys 107V of the fingerprint 107. In another example, based on the signal from the plurality of photosensors 109, the biometric information analysis circuit 1083 converts the different light intensities into bright or dark stripes. For example, the bright stripes show the positions of the plurality of valleys 107V. The dark strips show the positions of the plurality of ridges 107R. The bright stripes and the dark stripes together form the pattern of the fingerprint 107. Accordingly, the biometric information analysis circuit can determine the biometric information based on the light intensity distribution.

In some embodiments, in region N, a respective one of the plurality of valleys 107V of the fingerprint 107 does not directly contact with the surface 110 of the biometric sensor away from the base substrate 101, which will not affect the light path of light transmitted to the region N from the scanning light source S. Light transmitted to the region N cannot be totally reflected by the surface 110 of the biometric sensor, only a small portion of the light transmitted to the region N is reflected to the photo-sensing layer 105.

For example, a first valley 107V1 of a plurality of valleys 107V is in region N. Light is transmitted to a part of region N of the surface 110 of the biometric sensor corresponding to the first valley 107V1. Only approximately 4% of the light is reflected to the photo-sensing layer 105. The approximately 4% of the light is reflected to A1 region of the photo-sensing layer 105. At the same time, a region in direct contact with A1 region in the photo-sensing layer 105 corresponds to a respective one of the plurality of ridges 107R contacting with the region N, since the condition for total reflection is destroyed, most light will be refracted out from parts of region N corresponding to the plurality of ridges 107R. A portion far more less than the approximately 4% of the light will be reflected back to the photo-sensing layer 105. Accordingly, in Region N, there are difference between the light intensity corresponding to the plurality of valleys 107V and the light intensity corresponding to the plurality of ridges 107R. The light intensity of the light reflected by the region N is relatively weak, a portion of the fingerprint pattern corresponding to the region N is blurry, and the portion of the fingerprint pattern corresponding to the region N is not as clear as the portion of the fingerprint pattern corresponding to the region M.

Referring to FIG. 2 and FIG. 3A, in some embodiments, as the scanning light source S moves, the M region and the N region also moves based on the movement of the scanning light source S. As the scanning light source S moves in the scanning region R, a relatively complete biometric information is obtained.

In some embodiments, each of the touch detection layer 103, the light emitting layer 102, and the photo-sensing layer 105 can be disposed substantially throughout an entire area of the device. Optionally, an orthographic projection of the touch detection layer 103 on the base substrate 101 has a size equivalent to a size of an orthographic projection of the surface 110 of the biometric sensor on the base substrate 101. Optionally, an orthographic projection of the light emitting layer 102 on the base substrate 101 has a size equivalent to the size of the orthographic projection of the surface 110 of the biometric sensor on the base substrate 101. Optionally, an orthographic projection of the photo-sensing layer 105 on the base substrate 101 has a size equivalent to the size of the orthographic projection of the surface 110 of the biometric sensor on the base substrate 101. For example, the touch detection layer 103 can detect a touch position on any position of the surface 110 of the biometric sensor. The light emitting layer 102 can form a scanning light source S corresponding to any touch position on the surface 110 of the biometric sensor. The photo-sensing layer 105 can detect the light from the scanning light source S reflected by the surface 110 of the biometric sensor. So, a full screen fingerprint recognition can be performed.

In some embodiments, using the biometric sensor in the present disclosure, no stray light will be transmitted to the photo-sensing layer 105, and the collimated film can be omitted, which may reduce the thickness of the biometric sensor.

In some embodiments, the plurality of photosensors are photodiodes. Optionally, the plurality of photosensor are PIN type photodiodes made of amorphous silicon (a-Si) materials. When a photodiode is irradiated with light, a photocurrent is formed. The biometric information analysis circuit can determine the light intensity distribution based on photocurrents from the plurality of photosensors.

In some embodiments, the plurality of photosensors can be formed by forming a P-type semiconductor layer on the base substrate 101, forming an P-type semiconductor layer on a side of the P-type semiconductor layer away from the base substrate 101, forming an N-type semiconductor layer on a side of the intrinsic semiconductor layer away from the base substrate 101, and patterning the P-type semiconductor layer, the P-type semiconductor layer, and the N-type semiconductor layer to form the plurality of photosensors 109. The photo-sensing layer 105 is formed using method of forming a semiconductor, which not only simplifies the process, but produces a photo-sensing layer 105 of a larger size.

Figure 3B:
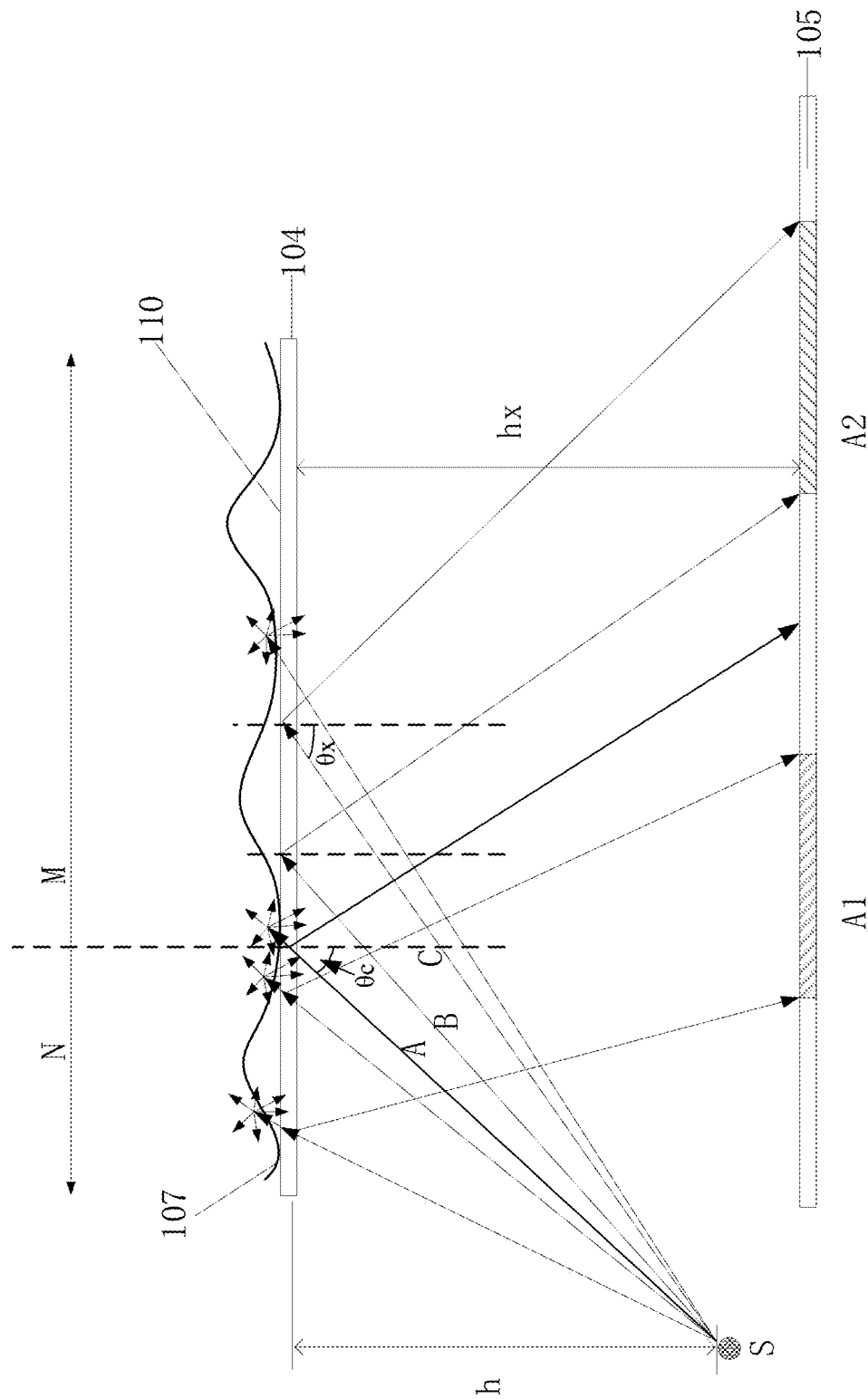
FIG. 3B is a schematic diagram illustrating a path of light irradiated from a scanning light source toward a surface of the biometric sensor in some embodiments according to the present disclosure.

FIG. 3B is a schematic diagram illustrating a path of light irradiated from a scanning light source toward a surface of the biometric sensor in some embodiments according to the present disclosure. Referring to FIG. 3B, θc denotes the critical angle. Light having an incident angle towards the surface 110 of the biometric sensor greater than the critical angle θc will be totally reflected by the surface 110 of the biometric sensor. Light having an incident angle smaller than the critical angle θc can be refracted out of the biometric sensor. In FIG. 3B, θx denotes an angle at which an intensity of light transmitted to the surface 110 is equal to 50% of an intensity of light transmitted to the surface 110 at the critical angle θc.

In some embodiments, an imaging range of the scanning light source S (e.g., a point light source) is from h*tan θc*M to h*tan θx*M, wherein h stands for a distance between the scanning light source S to the surface 110, hx stands for a distance between the photo-sensing layer 105 to the surface 110, θc stands for the critical angle, θx stands for an angle at which an intensity of light transmitted to the surface 110 is equal to 50% of an intensity of light transmitted to the surface 110 at the critical angle θc, and M can be expressed as (h+hx)/h.

In one example, the critical angle θc is 42 degrees. In another example, the angle θx is 70 degrees.

Figure 4:
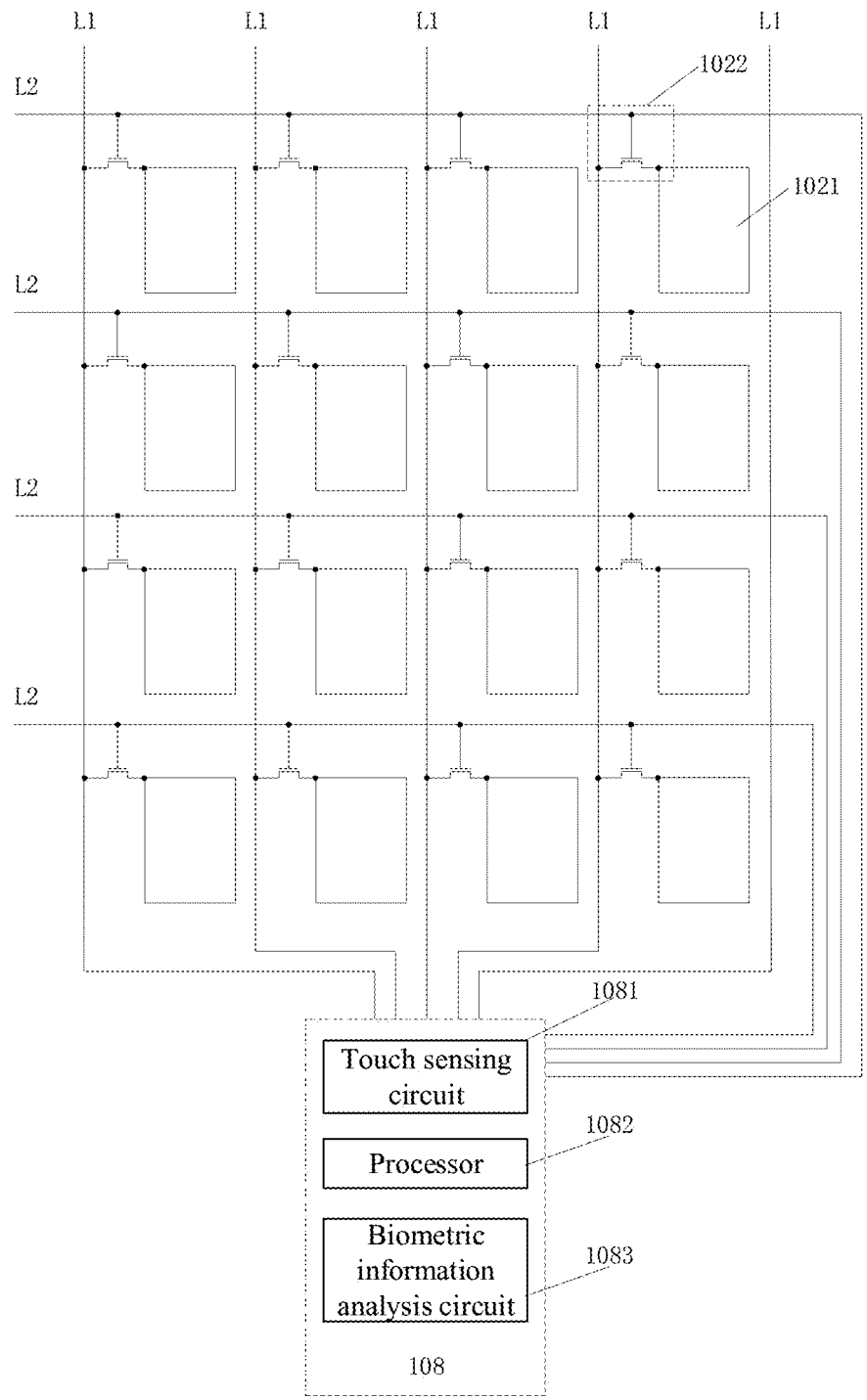
FIG. 4 is a plan view illustrating a structure of a light emitting layer in some embodiments according to the present disclosure.

FIG. 4 is a plan view illustrating a structure of a light emitting layer in some embodiments according to the present disclosure. Referring to FIG. 4, in some embodiments, the light emitting layer 102 includes an array of a plurality light emitting elements 1021, a plurality of thin film transistors 1022 respectively driving light emission of the plurality of light emitting elements 1021, a plurality of data lines L1, and a plurality of gate lines L2.

Optionally, a respective one of the plurality of data lines L1 is electrically connected to source electrodes of thin film transistors in a column of the plurality of thin film transistors 1022. Optionally, a respective one of the plurality of gate lines L2 is electrically connected to gate electrodes of thin film transistors in a row of the plurality of thin film transistors 1022. Optionally, drain electrodes of the plurality of thin film transistors 1022 are respectively electrically connected to the plurality of light emitting elements 1021.

In some embodiments, the processor 1082 is electrically connected to the plurality of data lines L1. Optionally, the processor 1082 is configured to control transmission of data signals to the plurality of light emitting elements 1021 respectively through the plurality of data lines L1.

In some embodiments, the processor is electrically connected to the plurality of gate lines L2. Optionally, the processor 1082 is configured to turn on or off the plurality of thin film transistors 1022 respectively through the plurality of gate lines L2.

In some embodiments, by sending data signals through a respective one of the plurality of data line L1 to one of the plurality of light emitting elements 1021, and by tuning on or off the one of the plurality of light emitting elements 1021 through a respective one of the plurality of gate lines L2, the light emission of the one of the plurality of light emitting elements 1021 can be controlled to form a scanning light source. In one example, the processor 1082 turns on the one of the plurality of light emitting elements 1021 through a respective one of the plurality of gate lines L2. Subsequently, the processor 1082 sends a data signal through a respective one of the plurality of data lines L1 to the one of the plurality of light emitting elements 1021 to control the light emission of the one of the light emitting elements 1021. In another example, the processor 1082 sends the data signal through the respective one of the plurality of data lines L1 to the one of the plurality of light emitting elements 1021. Subsequently, the processor 1082 controls the respective one of the plurality of gate lines L2 to turn on or off the one of the plurality of light emitting elements 1021 to control the light emission of the one of the light emitting elements 1021.

Various arrangements may be used to form the scanning light source. And Various scanning patterns may be used by a scanning light source. Examples of scanning patterns suitable for the scanning light source include, but are not limited to a linear scanning lines and a plurality of point light sources.

Figure 5A:
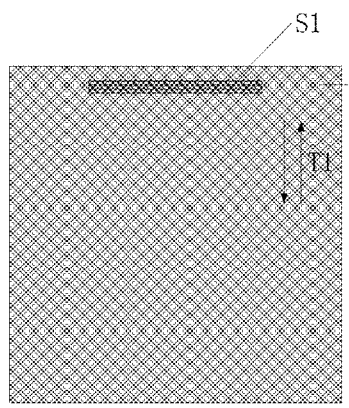
FIG. 5A is a schematic diagram of a region of a light emitting layer corresponding to a scanning region in some embodiments according to the present disclosure.

FIG. 5A is a schematic diagram of a region of a light emitting layer corresponding to a scanning region in some embodiments according to the present disclosure. Referring to both FIG. 4 and FIG. 5A, in some embodiments, the processor 1082 is configured to control multiple consecutive data lines of the plurality of data lines L1 extending through the scanning region R to simultaneously transmit data signals to sources electrodes of multiple columns of thin film transistors in the scanning region R. Subsequently, the processor 1082 is configured to turn on multiple rows of thin film transistors in the scanning region R through multiple consecutive gate lines of the plurality of gate lines L2, thereby forming a first linear scanning light source S1 limited in the scanning region R to scan the scanning region along a column direction T1.

Optionally, the processor 1082 is configured to turn on multiple rows of thin film transistors in the scanning region R, row-by-row, through multiple consecutive gate lines of the plurality of gate lines L2, row-by-row. Accordingly, the first linear scanning light source S1 is formed by a row of light emitting elements of the plurality of light emitting elements 1021 at a time.

Optionally, the processor 1082 is configured to turn on multiple rows of thin film transistors in the scanning region R, multirow-by-multirow, through multiple consecutive gate lines of the plurality of gate lines L2, multirow-by-multirow. Accordingly, the first linear scanning light source S1 is formed by multiple rows of light emitting elements of the plurality of light emitting elements 1021. For example, the processor 1082 is configured to turn on multiple rows of thin film transistors in the scanning region R, five-row-by-five-row, through multiple consecutive gate lines of the plurality of gate lines L2, five-row-by-five-row. Accordingly, the first linear scanning light source S1 is formed by five rows of light emitting elements of the plurality of light emitting elements 1021 at a time.

Optionally, the processor 1082 is configured to control the multiple consecutive gate lines of the plurality of gate lines L2 in a time-sequentially mode to allow the first linear scanning light source S1 moves along the column direction T1. For example, in order to enhance the quality of the fingerprint recognition, the first linear scanning light source S1 moves forward and backward along the column direction T1 to scan the scanning region R.

In some embodiments, a number of the multiple consecutive data lines of the plurality of data lines L1 transmitting data signals to source electrodes of multiple columns of thin film transistors determines the length of the first linear scanning light source S1. Optionally, based on the area of the touch region, the processor 1082 is configured to simultaneously transmit data signals through all the data lines of the plurality of data lines L1. Optionally, the processor 1082 is configured to simultaneously transmit data signals through multiple consecutive data lines of the plurality of data lines L1.

Figure 5B:
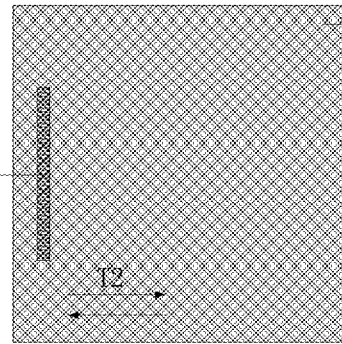
FIG. 5B is a schematic diagram of a region of a light emitting layer corresponding to a scanning region in some embodiments according to the present disclosure.

FIG. 5B is a schematic diagram of a region of a light emitting layer corresponding to a scanning region in some embodiments according to the present disclosure. Referring to both the FIG. 4 and FIG. 5B, in some embodiments, the processor 1082 is configured to simultaneously turn on multiple consecutive rows of thin film transistors in the scanning region R through multiple consecutive gate lines of the plurality of gate lines L2. Optionally, the processor 1082 is configured to control multiple consecutive data lines of the plurality of data lines L1 extending through the scanning region R to transmit data signals to sources electrodes of multiple columns of the thin film transistors of the plurality of thin film transistors in the scanning region, thereby forming a second linear scanning light source S2 limited in the scanning region R to scan the scanning region R along a row direction T2.

Optionally, the processor 1082 is configured to control multiple consecutive data lines of the plurality of data lines L1 extending through the scanning region R to transmit data signals, column-by-column, to sources electrodes of multiple columns of the thin film transistors of the plurality of thin film transistors in the scanning region, column-by-column. Accordingly, the second linear scanning light source S2 is formed by a column of light emitting elements of the plurality of light emitting elements 1021 at a time.

Optionally, the processor 1082 is configured to control multiple consecutive data lines of the plurality of data lines L1 extending through the scanning region R to transmit data signals, multicolumn-by-multicolumn, to sources electrodes of multiple columns of the thin film transistors of the plurality of thin film transistors in the scanning region, multicolumn-by-multicolumn. Accordingly, the second linear scanning light source S2 is formed by multiple columns of light emitting elements of the plurality of light emitting elements 1021. For example, the processor 1082 is configured to control multiple consecutive data lines of the plurality of data lines L1 extending through the scanning region R to transmit data signals, five-column-by-five-column, to sources electrodes of multiple columns of the thin film transistors of the plurality of thin film transistors in the scanning region, five-column-by-five-column. The second linear scanning light source S2 is formed by five columns of light emitting elements of the plurality of light emitting elements 1021 at a time.

Optionally, the processor 1082 is configured to send data signals to the multiple consecutive data lines of the plurality of data lines L2 in a time-sequentially mode to allow the second linear scanning light source S2 moves along the row direction T2. For example, in order to enhance the quality of the fingerprint recognition, the second linear scanning light source S2 moves forward and backward along the row direction T2 to scan the scanning region R.

In some embodiments, a number of the multiple consecutive gate lines of the plurality of gate lines L2 used to turn on multiple consecutive rows of thin film transistors determines the length of the second linear scanning light source S2. Optionally, based on the area of the touch region, the processor 1082 is configured to use all the gate line of the plurality of gate line L2 to simultaneously turn on the plurality of thin film transistors 1022. Optionally, the processor 1082 is configured to use multiple consecutive gate lines to simultaneously turn on the multiple consecutive rows of thin film transistors.

Figure 5C:
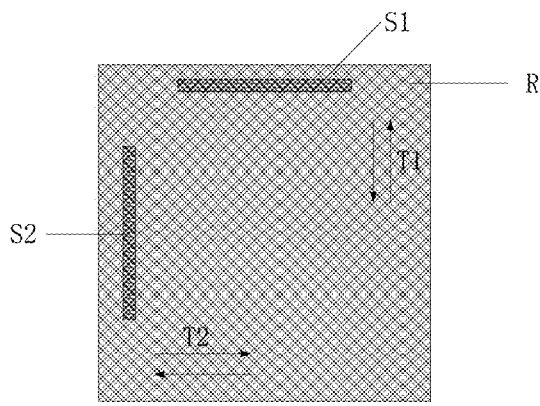
FIG. 5C is a schematic diagram of a region of a light emitting layer corresponding to a scanning region in some embodiments according to the present disclosure.

FIG. 5C is a schematic diagram of a region of a light emitting layer corresponding to a scanning region in some embodiments according to the present disclosure. Referring to both FIG. 4 and FIG. 5C, in some embodiments, the processor 1082 is further configured to control the light emitting layer to form the scanning light source in a time-division mode including a first scanning mode, and a second scanning mode. Optionally, the first scanning mode includes a plurality of first scanning periods. Optionally, the second scanning mode includes a plurality of second scanning periods. Optionally, the plurality of first scanning periods and the plurality of second scanning periods are alternately arranged.

In some embodiments, in the first scanning mode, the processor 1082 is configured to control multiple consecutive data lines of the plurality of data lines L1 extending through the scanning region R to simultaneously transmit data signals to sources electrodes of multiple columns of thin film transistors in the scanning region R, and configured to turn on multiple rows of thin film transistors in the scanning region R through multiple consecutive gate lines of the plurality of gate lines L2 in the plurality of first scanning periods in a first sequential order, thereby forming a first linear scanning light source S1 limited in the scanning region R to scan the scanning region along a column direction T1.

Optionally, the first sequential order is a row-by-row order. Optionally, in the first scanning mode, the processor 1082 is configured to turn on multiple rows of thin film transistors in the scanning region R, row-by-row, through multiple consecutive gate lines of the plurality of gate lines L2, row-by-row. Accordingly, the first linear scanning light source S1 is formed by a row of light emitting elements of the plurality of light emitting elements 1021.

Optionally, the first sequential order is a multirow-by-multirow order. Optionally, in the first scanning mode, the processor 1082 is configured to turn on multiple rows of thin film transistors in the scanning region R, multirow-by-multirow, through multiple consecutive gate lines of the plurality of gate lines L2, multirow-by-multirow. Accordingly, the first linear scanning light source S1 is formed by multiple rows of light emitting elements of the plurality of light emitting elements 1021. For example, the processor 1082 is configured to turn on multiple rows of thin film transistors in the scanning region R, five-row-by-five-row, through multiple consecutive gate lines of the plurality of gate lines L2, five-row-by-five-row. Accordingly, the first linear scanning light source S1 is formed by five rows of light emitting elements of the plurality of light emitting elements 1021 at a time.

Optionally, the processor 1082 is configured to control the multiple consecutive gate lines of the plurality of gate lines L2 in a time-sequentially mode to allow the first linear scanning light source S1 moves along the column direction T1. For example, in order to enhance the quality of the fingerprint recognition, the first linear scanning light source S1 moves forward and backward along the column direction T1 to scan to scanning region R.

In some embodiments, a number of the multiple consecutive data lines of the plurality of data lines L1 transmitting data signals to source electrodes of multiple columns of thin film transistors determines the length of the first linear scanning light source S1. Optionally, based on the area of the touch region, the processor 1082 is configured to simultaneously transmit data signals through all the data lines of the plurality of data lines L1. Optionally, the processor 1082 is configured to simultaneously transmit data signals through multiple consecutive data lines of the plurality of data lines L1.

In some embodiments, in the second scanning mode, the processor is further configured to simultaneously turn on multiple consecutive rows of thin film transistors in the scanning region through multiple consecutive gate lines, and configured to control multiple consecutive data lines extending through the scanning region to transmit data signals to sources electrodes of multiple columns of thin film transistors in the scanning region in the plurality of second scanning periods in a second sequential order, thereby forming a second linear scanning light source limited in the scanning region R to scan the scanning region R along a row direction.

Optionally, the second sequential order is a column-by-column order. Optionally, in the second scanning mode, the processor 1082 is configured to control multiple consecutive data lines of the plurality of data lines L1 extending through the scanning region R to transmit data signals, column-by-column, to sources electrodes of multiple columns of the thin film transistors of the plurality of thin film transistors in the scanning region, column-by-column. Accordingly, the second linear scanning light source S2 is formed by a column of light emitting elements of the plurality of light emitting elements 1021.

Optionally, the second sequential order is a multicolumn-by-multicolumn order. Optionally, in the second scanning mode, the processor 1082 is configured to control multiple consecutive data lines of the plurality of data lines L1 extending through the scanning region R to transmit data signals, multicolumn-by-multicolumn, to sources electrodes of multiple columns of the thin film transistors of the plurality of thin film transistors in the scanning region, multicolumn-by-multicolumn. Accordingly, the second linear scanning light source S2 is formed by multiple columns of light emitting elements of the plurality of light emitting elements 1021. For example, the processor 1082 is configured to control multiple consecutive data lines of the plurality of data lines L1 extending through the scanning region R to transmit data signals, five-column-by-five-column, to sources electrodes of multiple columns of the thin film transistors of the plurality of thin film transistors in the scanning region, five-column-by-five-column. The second linear scanning light source S2 is formed by five columns of light emitting elements of the plurality of light emitting elements 1021 at a time.

Optionally, the processor 1082 is configured to send data signals to the multiple consecutive data lines of the plurality of data lines L2 in a time-sequentially mode to allow the second linear scanning light source S2 moves along the row direction T2. For example, in order to enhance the quality of the fingerprint recognition, the second linear scanning light source S2 moves forward and backward along the row direction T2 to scan to scanning region R.

In some embodiments, a number of the multiple consecutive gate lines of the plurality of gate lines L2 used to turn on multiple consecutive rows of thin film transistors determines the length of the second linear scanning light source S2. Optionally, based on the area of the touch region, the processor 1082 is configured to use all the gate line of the plurality of gate line L2 to simultaneously turn on the plurality of thin film transistors 1022. Optionally, the processor 1082 is configured to use multiple consecutive gate lines to simultaneously turn on the multiple consecutive rows of thin film transistors.

In some embodiments, a biometric information analysis circuit has a clearer fingerprint pattern of a portion of fingerprint parallel to a linear light source. The biometric information analysis circuit may obtain a blurry fingerprint pattern of a portion of the fingerprint perpendicular to the linear light source, for example, a contrast between dark stripes and bright stripes corresponding to the portion of the fingerprint perpendicular to the linear light source is weak. Using both the first linear scanning light source S1 moving along the column direction T1, and the second linear light source S2 moving along the row direction T2, a pattern of the fingerprint may be clearer.

Optionally, the first linear scanning light source S1 moves in a first direction perpendicular to a second direction along which the second linear light source moves, which makes it fast to scan a whole scanning region and to recognize a fingerprint. Optionally, in order to enhance the quality of the fingerprint recognition or the quality of the biometric information, the first linear scanning light source S1 may move towards and backwards along the first direction. The second linear light source S2 may move towards and backwards along the second direction.

Optionally, the first direction is not perpendicular to the second direction. For example, the included angle between the first direction and the second direction is an acute angle.

Optionally, a respective one of the first scanning periods directly precedes one of the second scanning periods. In another example, a respective one of the second scanning periods directly precedes one of the first scanning periods.

In some embodiments, the first scanning mode and the second scanning mode is performed at the same time.

In some embodiments, a low quality of fingerprint pattern is acceptable, the scanning of the scanning region can be performed only with one linear light source. Using only one linear light source not only reduces the time spent on the scanning and on the data processing, but obtains a fingerprint pattern in a short time period.

Figure 6A:
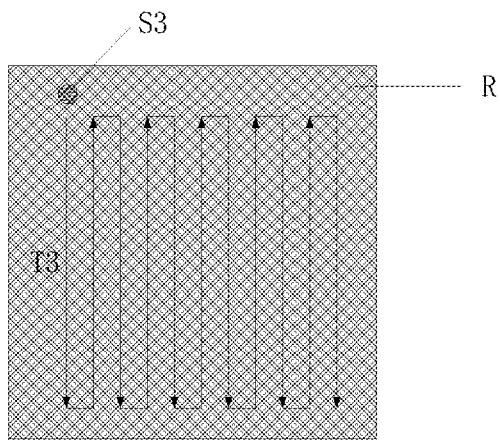
FIG. 6A is a schematic diagram of a region of a light emitting layer corresponding to a scanning region in some embodiments according to the present disclosure.

FIG. 6A is a schematic diagram of a region of a light emitting layer corresponding to a scanning region in some embodiments according to the present disclosure. Referring to both FIG. 4 and FIG. 6A, in some embodiments, the processor 1082 is further configured to control multiple light emitting elements 1021 limited in the scanning region to time-sequentially forming a plurality of point light sources S3 consecutively arranged. Optionally, one of the plurality of point light sources S3 is turned on at a time while a remainder of the plurality of point light sources S3 are turned off to form the scanning pattern including linear scanning lines. Optionally, a respective one of the plurality of point light sources S3 includes one or multiple adjacent light emitting elements. The light intensity in each direction of one of the plurality of point light sources S3 is relatively uniform. Using the plurality of point light sources S3 to scan the scanning region R, a relatively clear fingerprint pattern can be obtained.

Optionally, the consecutively arranged point light sources of the plurality of light source S3 are time-sequentially turned on, allowing one point light source turned on and the remaining point light sources turned off at a time. Optionally, the consecutively arranged point light sources are spatially sequentially turned on to form the scanning pattern including linear scanning lines.

Various routes can be used by the plurality of point light sources S3 to scan the scanning region R. Optionally, a route of the plurality of point light sources S3 is along a continuous folded line including a plurality of linear lines parallel to each other. Optionally, a route includes a plurality of linear lines parallel to each other extending along a column direction of the scanning region, and the plurality of linear lines is arranged consecutively along a row direction of the scanning region. Optionally, a route includes a plurality of linear lines parallel to each other extending along a row direction of the scanning region, and the plurality of linear lines is arranged consecutively along a column direction of the scanning region. Optionally, a route includes a plurality of linear lines parallel to each other along a diagonal direction of the scanning region, and the plurality of linear lines is arranged consecutively along a direction perpendicular to the diagonal direction of the scanning region.

In some embodiments, referring to FIG. 6A, the scanning pattern includes a continuous folded line including a plurality of linear lines parallel to each other. For example, the processor 1082 controls the light emitting elements to time-sequentially turn on and off a long a direction T3 to form a continuous folded line shown in FIG. 6A.

Figure 6B:
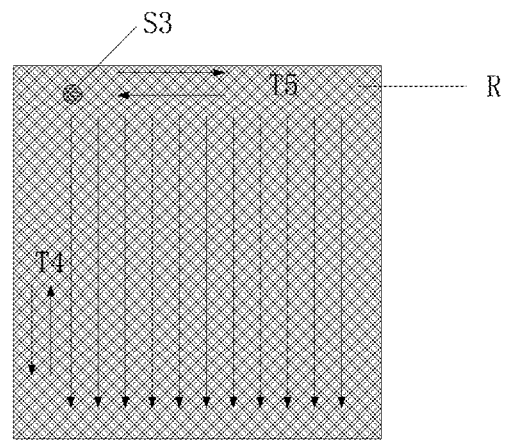
FIG. 6B is a schematic diagram of a region of a light emitting layer corresponding to a scanning region in some embodiments according to the present disclosure.

FIG. 6B is a schematic diagram of a region of a light emitting layer corresponding to a scanning region in some embodiments according to the present disclosure. Referring to FIG. 6B, the scanning pattern includes the plurality of linear scanning lines parallel to each other. Optionally, the route of the plurality of point light source S3 include the plurality of linear scanning lines parallel to each other extending along a column direction T4 of the scanning region R. Optionally, the plurality of linear lines is arranged consecutively along a row direction T5 of the scanning region R.

Figure 6C:
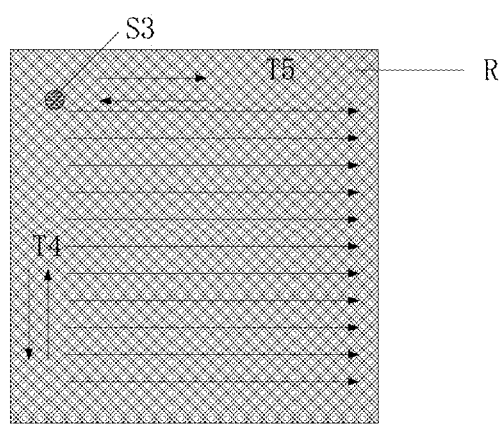
FIG. 6C is a schematic diagram of a region of a light emitting layer corresponding to a scanning region in some embodiments according to the present disclosure.

FIG. 6C is a schematic diagram of a region of a light emitting layer corresponding to a scanning region in some embodiments according to the present disclosure. Referring to FIG. 6C, the scanning pattern includes the plurality of linear scanning lines parallel to each other. Optionally, the route of the plurality of point light source S3 include the plurality of linear scanning lines parallel to each other extending along a row direction T5 of the scanning region R. Optionally, the plurality of linear lines is arranged consecutively along a column direction T4 of the scanning region R.

Figure 6D:
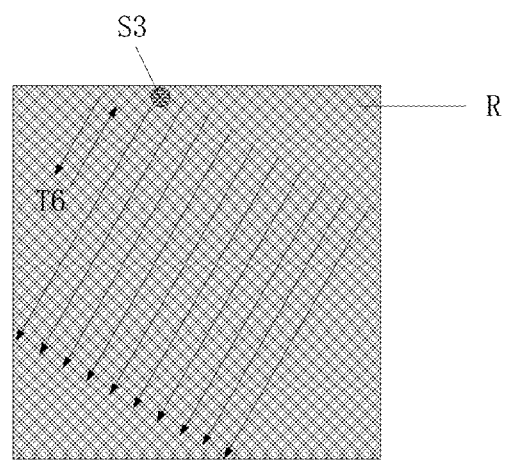
FIG. 6D is a schematic diagram of a region of a light emitting layer corresponding to a scanning region in some embodiments according to the present disclosure.

FIG. 6D is a schematic diagram of a region of a light emitting layer corresponding to a scanning region in some embodiments according to the present disclosure. Referring to FIG. 6D, the scanning pattern includes the plurality of linear scanning lines parallel to each other. Optionally, the route of the plurality of point light source S3 include the plurality of linear scanning lines parallel to each other extending along a diagonal direction T6 of the scanning region R. Optionally, the plurality of linear lines is arranged consecutively along direction perpendicular to the diagonal direction T6 of the scanning region R.

Various types of the plurality of light emitting elements may be used in the light emitting layer. Examples of types of the plurality of light emitting elements includes, but are not limited to, a plurality of light emitting elements emitting visible light, and a plurality of light emitting elements emitting invisible light.

Figure 7:
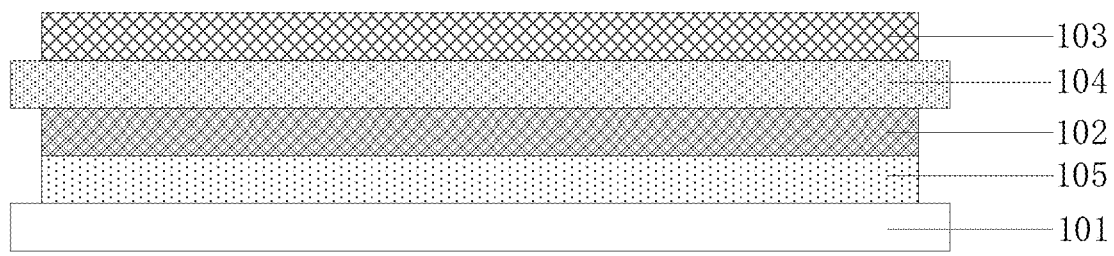
FIG. 7 is a schematic diagram of a structure of a biometric sensor in some embodiment according to the present disclosure.

FIG. 7 is a schematic diagram of a structure of a biometric sensor in some embodiment according to the present disclosure. Referring to FIG. 7, in some embodiments, the touch detection layer 103 is disposed on a side of the encapsulating cover 104 away from the base substrate 101. Optionally, the touch detection layer 103 can be formed using on-cell technology, disposing the touch detection layer 103 on the side of the encapsulating cover 104. Optionally, the touch detection layer 103 can be formed by forming a plurality of touch-control electrodes using the side of the encapsulating cover 104 away from the base substrate 101.

Referring to FIG. 1, in some embodiments, the touch detection layer 103 is between the encapsulating cover 104 and the light emitting layer 102. Optionally, the encapsulating cover 104 may protect the touch detection layer 103.

Figure 8:
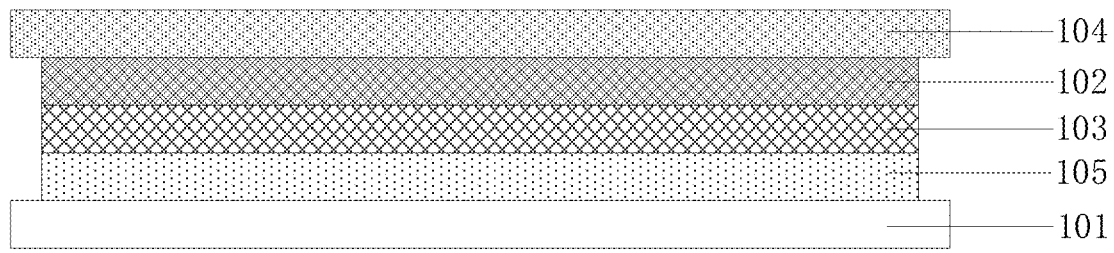
FIG. 8 is a schematic diagram of a structure of a biometric sensor in some embodiment according to the present disclosure.

FIG. 8 is a schematic diagram of a structure of a biometric sensor in some embodiment according to the present disclosure. Referring to FIG. 8, in some embodiments, the touch detection layer 103 is between the light emitting layer 102 and the photo-sensing layer 105. Optionally, the light emitting layer 102 is in direct adjacent to the encapsulating cover 104, which may reduce the loss of light emitted from the light emitting layer 102.

In some embodiments, the touch detection layer 103 includes a plurality of self-capacitive touch electrodes. Optionally, the plurality of self-capacitive touch electrodes are arranged in array. For example, the touch sensing circuit 1081 can determine the touch position by detecting the capacitance value of the plurality of self-capacitive touch electrodes.

In some embodiments, the touch detection layer 103 includes a plurality of touch scanning electrodes and a plurality of touch sensing electrodes intersecting each other. For example, the touch sensing circuit can determine the touch position by detecting a mutual capacitance between a respective one of the plurality of touch scanning electrode and a respective one of the plurality of touch sensing electrodes. By using the plurality of touch scanning electrodes and the plurality of touch sensing electrodes, the touch position can be accurately determined.

In some embodiments, the touch sensing circuit can determine the touch position using optical detection.

In another aspect, the present disclosure also provides a method for detecting a biometric information. the method for detecting a biometric information includes providing a biometric sensor including a base substrate, a light emitting layer and a touch detection layer on the base substrate, an encapsulating cover on a side of the light emitting layer away from the based substrate, and a photo-sensing layer between the light emitting layer and the base substrate.

Figure 9:
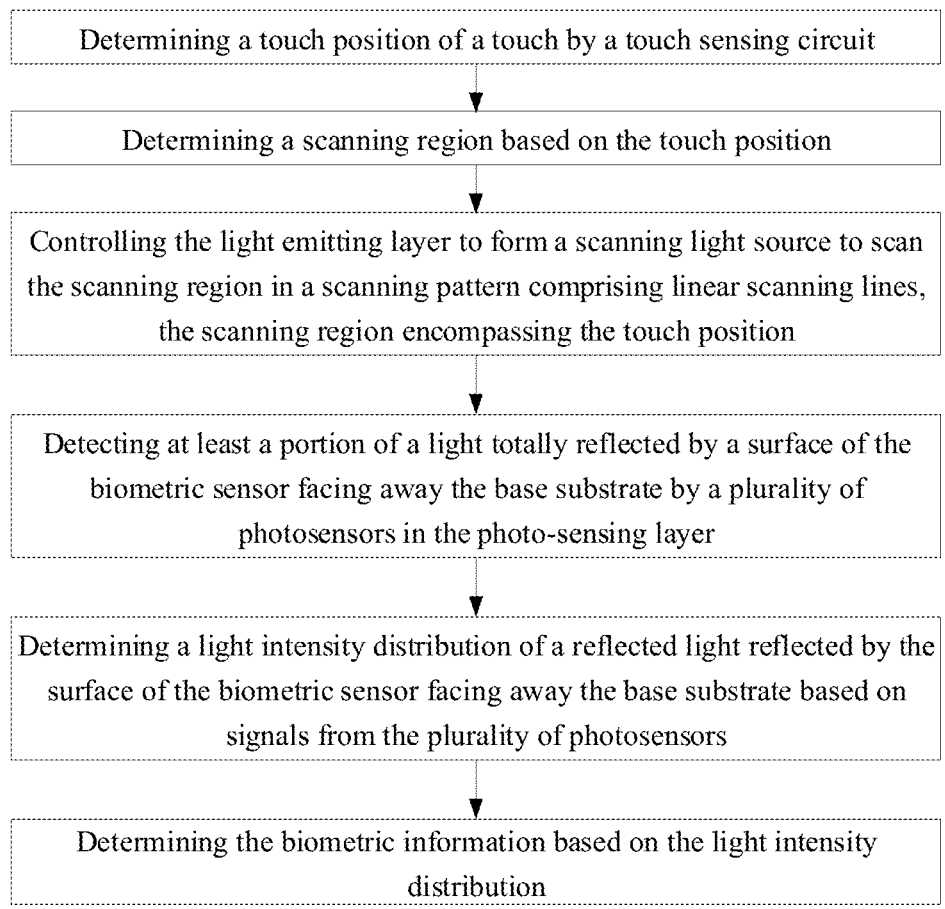
FIG. 9 is a flow chart illustrating a method for detecting a biometric information in some embodiments according to the present disclosure.

FIG. 9 is a flow chart illustrating a method for detecting a biometric information in some embodiments according to the present disclosure. Referring to FIG. 9, in some embodiments, the method for detecting the biometric information includes determining a touch position of a touch by a touch sensing circuit, determine a scanning region based on the touch position. Optionally, the scanning region encompasses the touch position. Optionally, the touch position is determined by a processor.

In some embodiments, the method for detecting the biometric information includes controlling the light emitting layer to form a scanning light source to scan the scanning region in a scanning pattern. Optionally, the scanning pattern includes linear scanning lines. Optionally, forming the scanning light source is controlled by the processor.

In some embodiments, the method for detecting the biometric information includes detecting at least a portion of a light totally reflected by a surface of the biometric sensor facing away the base substrate by a plurality of photosensors in the photo-sensing layer. Optionally, signals detected by the plurality of photosensors are sent to a biometric information analysis circuit.

In some embodiments, the method for detecting the biometric information includes determining a light intensity distribution of a reflected light reflected by the surface of the biometric sensor facing away the base substrate on signals from the plurality of photosensors. Optionally, the light intensity is determined by the biometric information analysis circuit.

In some embodiments, the method for detecting the biometric information includes determining the biometric information based on the light intensity distribution. Optionally, the biometric information is determined by the biometric information analysis circuit.

In some embodiments, the processor can control the light emitting layer to form the scanning light source to scan the scanning region corresponding to the touch position, and the biometric information analysis circuit can collect signals detected by the plurality of photosensors in the photo-sensing layer, determine a light intensity distribution of a reflected light reflected by the surface of the biometric sensor based on the signal from the plurality of photosensors, and determine the biometric information (e.g. fingerprint pattern) based on the light intensity distribution. Since the scanning light source can be formed in any portion of the light emitting layer, and the plurality of photosensors are adopted to detect at least a portion of a light totally reflected by the surface of the biometric sensor. The biometric information (e.g. fingerprint pattern) can be obtained from any portion of the screen of the devices. Optionally, the photo-sensing layer can be formed using method of forming semiconductors, the method of forming semiconductors is simple and can form large size device easily. Optionally, the light emitting by the scanning light source can be reflected or totally reflected by the surface of the biometric sensor toward the photo-sensing layer. The plurality of photosensors are not affected by the stray light. A collimated layer can be omitted, which may reduce the thickness of the biometric sensor.

In some embodiments, referring to both FIG. 5A, 5B, 5C, and FIG. 9, controlling the light emitting layer to form a scanning light source to scan the scanning region includes the processor controlling the light emitting layer to form a first linear scanning light source S1 and a second linear scanning light source S2. Optionally, the processor controls the first linear scanning light source S1 to move along a column direction T1. Optionally, the processor controls the second linear scanning light source S2 along a row direction T2. Optionally, the column direction T1 is perpendicular to the row direction T2.

In some embodiments, the light emitting layer includes an array of a plurality of light emitting elements; a plurality of thin film transistors respectively driving light emission of the plurality of light emitting elements; a plurality of data lines; and a plurality of gate lines. Optionally, a respective one of the plurality of data lines is electrically connected to source electrodes of thin film transistors in a column of the plurality of thin film transistors. Optionally, a respective one of the plurality of gate lines is electrically connected to gate electrodes of thin film transistors in a row of the plurality of thin film transistors. Optionally, drain electrodes of the plurality of thin film transistors are respectively electrically connected to the plurality of light emitting elements. Optionally, the processor is configured to control turning on or off the plurality of thin film transistors respectively through the plurality of gate lines. Optionally, the processor is configured to control transmission of data signals to the plurality of light emitting elements respectively through the plurality of data lines.

Optionally, controlling the light emitting layer to form a scanning light includes controlling multiple consecutive data lines extending through the scanning region to simultaneously transmit data signals to sources electrodes of multiple columns of thin film transistors in the scanning region, and turning on multiple rows of thin film transistors in the scanning region through multiple consecutive gate lines in a first sequential order, to form a first linear scanning light source limited in the scanning region to scan the scanning region along a column direction.

Optionally, the first sequential order is a row-by-row order. Optionally, the multiple rows of thin film transistors is turned on in the scanning region, row-by-row, through multiple consecutive gate lines, row-by-row. Accordingly, the first linear scanning light source is formed by a row of the light emitting elements of the plurality of light emitting elements at a time.

Optionally, the first sequential order is a multirow-by-multirow order. Optionally, the multiple rows of thin film transistors is turned on in the scanning region, multirow-by-multirow, through multiple consecutive gate lines, multirow-by-multirow. Accordingly, the first linear scanning light source is formed by multiple rows of the light emitting elements of the plurality of light emitting elements. For example, the multiple rows of thin film transistors is turned on in the scanning region, five-row-by-five-row, through multiple consecutive gate lines, five-row-by-five-row. Accordingly, the first linear scanning light source is formed by five rows of the light emitting elements of the plurality of light emitting elements at a time.

Optionally, controlling the light emitting layer to form a scanning light includes simultaneously turning on multiple consecutive rows of thin film transistors in the scanning region through multiple consecutive gate lines; and controlling multiple consecutive data lines extending through the scanning region to transmit data signals to sources electrodes of multiple columns of thin film transistors in the scanning region in a second sequential order, to form a second linear scanning light source limited in the scanning region to scan the scanning region along a row direction.

Optionally, the second sequential order is a column-by-column order. Optionally, the multiple consecutive data lines extending through the scanning region is controlled to transmit data signals, column-by-column, to sources electrodes of multiple columns of thin film transistors in the scanning region, column-by-column. Accordingly, the second linear scanning light source is formed by a column of the light emitting elements at a time.

Optionally, the second sequential order is a multicolumn-by-multicolumn order. Optionally, the multiple consecutive data lines extending through the scanning region is controlled to transmit data signals, multicolumn-by-multicolumn, to sources electrodes of multiple columns of thin film transistors in the scanning region, multicolumn-by-multicolumn. Accordingly, the second linear scanning light source is formed by multiple columns of the light emitting elements at a time. For example, the multiple consecutive data lines extending through the scanning region is controlled to transmit data signals, five-columns-by-five-column, to sources electrodes of multiple columns of thin film transistors in the scanning region, five-columns-by-five-column. Accordingly, the second linear scanning light source is formed by five columns of the light emitting elements at a time.

In some embodiments, the processor is further configured to perform a time-division mode including a first scanning mode, and a second scanning mode. Optionally, the first scanning mode includes a plurality of first scanning periods. Optionally, the second scanning mode includes a plurality of second scanning periods. Optionally, the plurality of first scanning periods and the plurality of second scanning periods are alternately arranged.

Optionally, controlling the light emitting layer to form the scanning light source in the first scanning mode includes controlling multiple consecutive data lines extending through the scanning region to simultaneously transmit data signals to sources electrodes of multiple columns of thin film transistors in the scanning region, and turning on multiple rows of thin film transistors in the scanning region through multiple consecutive gate lines in a first sequential order, thereby forming a first linear scanning light source limited in the scanning region to scan the scanning region along a column direction.

Optionally, controlling the light emitting layer to form the scanning light source in the second scanning mode includes simultaneously turning on multiple consecutive rows of thin film transistors in the scanning region through multiple consecutive gate lines; and controlling multiple consecutive data lines extending through the scanning region to transmit data signals to sources electrodes of multiple columns of thin film transistors in the scanning region in a second sequential order, thereby forming a second linear scanning light source limited in the scanning region to scan the scanning region along a row direction.

Optionally, the method further includes turning on or off the plurality of thin film transistors respectively through the plurality of gate lines, and controlling transmission of data signals to the plurality of light emitting elements respectively through the plurality of data lines, in a time-division mode including a first scanning mode and a second scanning mode. The first scanning mode includes a plurality of first scanning periods. The second scanning mode includes a plurality of second scanning periods. The plurality of first scanning periods and the plurality of second scanning periods are alternately arranged. Optionally, controlling the light emitting layer to form the scanning light source in the first scanning mode includes controlling multiple consecutive data lines extending through the scanning region to simultaneously transmit data signals to sources electrodes of multiple columns of thin film transistors in the scanning region, and turning on multiple rows of thin film transistors in the scanning region through multiple consecutive gate lines in the plurality of first scanning periods in a first sequential order, thereby forming a first linear scanning light source limited in the scanning region to scan the scanning region along a column direction. Optionally, controlling the light emitting layer to form the scanning light source in the second scanning mode includes simultaneously turning on multiple consecutive rows of thin film transistors in the scanning region through multiple consecutive gate lines; and controlling multiple consecutive data lines extending through the scanning region to transmit data signals to sources electrodes of multiple columns of thin film transistors in the scanning region in the plurality of second scanning periods in a second sequential order, thereby forming a second linear scanning light source limited in the scanning region to scan the scanning region along a row direction.

In some embodiments, referring to both FIG. 6A, 6B, 6C, 6D, and FIG. 9, controlling the light emitting layer to form a scanning light source to scan the scanning region includes the processor controlling the light emitting layer to form a plurality of point light sources consecutively arranged.

Optionally, controlling the light emitting layer to form the scanning light source includes controlling multiple light emitting elements limited in the scanning region to time-sequentially forming a plurality of point light sources consecutively arranged, one of the plurality of point light sources turning on at a time while a remainder of the plurality of point light sources turned off, thereby forming the scanning pattern including linear scanning lines. Optionally, a respective one of the plurality of point light sources includes one or multiple adjacent light emitting elements.

Optionally, the scanning pattern includes a continuous folded line including a plurality of linear lines parallel to each other.

Various routes can be used by the plurality of point light sources S3 to scan the scanning region R. Optionally, a route of the plurality of point light sources S3 is along a continuous folded line including a plurality of linear lines parallel to each other. Optionally, a route includes a plurality of linear lines parallel to each other extending along a column direction of the scanning region, and the plurality of linear lines is arranged consecutively along a row direction of the scanning region. Optionally, a route includes a plurality of linear lines parallel to each other extending along a row direction of the scanning region, and the plurality of linear lines is arranged consecutively along a column direction of the scanning region. Optionally, a route includes a plurality of linear lines parallel to each other extending along a diagonal direction of the scanning region, and the plurality of linear lines is arranged consecutively along a direction perpendicular to the diagonal direction of the scanning region.

In another aspect, the present disclosure provides a display apparatus including the biometric sensor herein and one or more integrated circuits connected to the biometric sensor. Examples of appropriate display apparatuses include, but are not limited to, an electronic paper, a mobile phone, a tablet computer, a television, a monitor, a notebook computer, a digital album, a GPS, etc.

Optionally, a display apparatus including the biometric sensor herein can perform full screen biometric information recognition (e.g. fingerprint recognition). Only when a touch is detected by the touch detection layer 103, the processor can control the light emitting layer to form a scanning light source to scan the scanning region. the scanning region encompasses the touch position. The light emitted by the light emitting layer can be blocked by the finger, and the display result will not be affected. Optionally, the photo sensing layer is compatible with the method of fabricating semiconductor used in the display apparatus, which makes it easy to produce the display apparatus having the biometric sensor herein.

In some embodiments, the display apparatus having the biometric sensor herein includes a display panel. Optionally, the display panel is the light emitting layer of the biometric sensor herein.

Optionally, the display panel (e.g. light emitting layer) is an OLED display panel. The processor may control the plurality of data lines, and the plurality of gate lines to control the light emitting from the plurality of subpixels. Optionally, the processor controls the display panel to form a scanning light source in the scanning region to scan the scanning region. At the same time, the processor controls the portion of the display panel other than the scanning region to perform image display. So, the processor can perform the finger print recognition at the same time display images.

In some embodiments, the display apparatus includes a touch-control layer. Optionally, the touch-control layer is the touch detection layer. Optionally, the display apparatus has an encapsulating cover. Optionally, the display apparatus and the biometric sensor share a same encapsulating cover.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A biometric sensor configured to detect a biometric information, comprising:
    a base substrate;
    a light emitting layer and a touch detection layer on the base substrate;
    an encapsulating cover on a side of the light emitting layer away from the base substrate;
    a photo-sensing layer between the light emitting layer and the base substrate, and comprising a plurality of photosensors configured to detect at least a portion of a light totally reflected by a surface of the biometric sensor in touch with a skin of a user;
    a touch sensing circuit configured to determine a touch position of a touch;
    a processor configured to determine a scanning region based on the touch position, and configured to control the light emitting layer to form a scanning light source to scan the scanning region in a scanning pattern, the scanning region encompassing the touch position; and
    a biometric information analysis circuit configured to determine a light intensity distribution of a reflected light reflected by the surface of the biometric sensor in touch with the skin of the user based on signals from the plurality of photosensors, and configured to determine the biometric information based on the light intensity distribution;
    wherein the processor is configured to control multiple consecutive data lines extending through the scanning region to simultaneously transmit data signals to sources electrodes of multiple columns of thin film transistors in the scanning region, and configured to turn on multiple rows of thin film transistors in the scanning region, through multiple consecutive gate lines, thereby forming a first linear scanning light source limited in the scanning region to scan the scanning region along a column direction.

2. The biometric sensor of claim 1, wherein the scanning pattern comprises linear scanning lines.

3. The biometric sensor of claim 1, wherein the light emitting layer comprises:
    an array of a plurality of light emitting elements;
    a plurality of thin film transistors respectively driving light emission of the plurality of light emitting elements;
    a plurality of data lines; and
    a plurality of gate lines;
    wherein a respective one of the plurality of data lines is electrically connected to source electrodes of thin film transistors in a column of the plurality of thin film transistors;
    a respective one of the plurality of gate lines is electrically connected to gate electrodes of thin film transistors in a row of the plurality of thin film transistors;
    drain electrodes of the plurality of thin film transistors are respectively electrically connected to the plurality of light emitting elements; and
    the processor is configured to control turning on or off the plurality of thin film transistors respectively through the plurality of gate lines, and configured to control transmission of data signals to the plurality of light emitting elements respectively through the plurality of data lines.

4. The biometric sensor of claim 1, wherein the processor is further configured to simultaneously turn on multiple consecutive rows of thin film transistors in the scanning region through multiple consecutive gate lines, and configured to control multiple consecutive data lines extending through the scanning region to transmit data signals to sources electrodes of multiple columns of thin film transistors in the scanning region thereby forming a second linear scanning light source limited in the scanning region to scan the scanning region along a row direction.

5. The biometric sensor of claim 1, wherein the processor is further configured to control the light emitting layer to form the scanning light source in a time-division mode comprising a first scanning mode, and a second scanning mode;
    the first scanning mode comprises a plurality of first scanning periods;
    the second scanning mode comprises a plurality of second scanning periods; and
    the plurality of first scanning periods and the plurality of second scanning periods are alternately arranged;
    in the first scanning mode, the processor is configured to control multiple consecutive data lines extending through the scanning region to simultaneously transmit data signals to sources electrodes of multiple columns of thin film transistors in the scanning region, and configured to turn on multiple rows of thin film transistors in the scanning region through multiple consecutive gate lines in the plurality of first scanning periods in a first sequential order, thereby forming a first linear scanning light source limited in the scanning region to scan the scanning region along a column direction; and
    in the second scanning mode, the processor is further configured to simultaneously turn on multiple consecutive rows of thin film transistors in the scanning region through multiple consecutive gate lines, and configured to control multiple consecutive data lines extending through the scanning region to transmit data signals to sources electrodes of multiple columns of thin film transistors in the scanning region in the plurality of second scanning periods in a second sequential order thereby forming a second linear scanning light source limited in the scanning region to scan the scanning region along a row direction.

6. The biometric sensor of claim 1, wherein the processor is configured to control multiple light emitting elements limited in the scanning region to time-sequentially forming a plurality of point light sources consecutively arranged, one of the plurality of point light sources turning on at a time while a remainder of the plurality of point light sources turned off, thereby forming the scanning pattern comprising linear scanning lines;

wherein a respective one of the plurality of point light sources comprises one or multiple adjacent light emitting elements.

7. The biometric sensor of claim 6, wherein the scanning pattern comprises a continuous folded line comprising a plurality of linear lines parallel to each other.

8. The biometric sensor of claim 1, wherein the touch detection layer is on a side of the encapsulating cover away from the base substrate.

9. The biometric sensor of claim 1, wherein the touch detection layer is between the encapsulating cover and the light emitting layer.

10. The biometric sensor of claim 1, wherein the touch detection layer is between the light emitting layer and the photo-sensing layer.

11. The biometric sensor of claim 1, wherein the touch detection layer comprises a plurality of touch scanning electrode and a plurality of touch sensing electrodes intersecting each other.

12. A display apparatus, comprising the biometric sensor of claim 1, and one or more integrated circuits connected to the biometric sensor.

13. A method for detecting a biometric information, comprising:
    providing a biometric sensor comprising a base substrate, a light emitting layer and a touch detection layer on the base substrate, an encapsulating cover on a side of the light emitting layer away from the base substrate, and a photo-sensing layer between the light emitting layer and the base substrate;
    determining a touch position of a touch by a touch sensing circuit;
    determining a scanning region based on the touch position;
    controlling the light emitting layer to form a scanning light source to scan the scanning region in a scanning pattern, the scanning region encompassing the touch position;
    detecting at least a portion of a light totally reflected by a surface of the biometric sensor in touch with a skin of a user by a plurality of photosensors in the photo-sensing layer;
    determining a light intensity distribution of a reflected light reflected by the surface of the biometric sensor in touch with the skin of the user based on signals from the plurality of photosensors; and
    determining the biometric information based on the light intensity distribution;
    wherein the light emitting layer comprises:
    an array of a plurality of light emitting elements;
    a plurality of thin film transistors respectively driving light emission of the plurality of light emitting elements;
    a plurality of data lines; and
    a plurality of gate lines;
    wherein a respective one of the plurality of data lines is electrically connected to source electrodes of thin film transistors in a column of the plurality of thin film transistors;
    a respective one of the plurality of gate lines is electrically connected to gate electrodes of thin film transistors in a row of the plurality of thin film transistors; and
    drain electrodes of the plurality of thin film transistors are respectively electrically connected to the plurality of light emitting elements;
    wherein the method further comprises turning on or off the plurality of thin film transistors respectively through the plurality of gate lines, and controlling transmission of data signals to the plurality of light emitting elements respectively through the plurality of data lines, in a time-division mode comprising a first scanning mode and a second scanning mode;
    the first scanning mode comprises a plurality of first scanning periods;
    the second scanning mode comprises a plurality of second scanning periods; and
    the plurality of first scanning periods and the plurality of second scanning periods are alternately arranged;
    wherein controlling the light emitting layer to form the scanning light source in the first scanning mode comprises:
    controlling multiple consecutive data lines extending through the scanning region to simultaneously transmit data signals to sources electrodes of multiple columns of thin film transistors in the scanning region, and
    turning on multiple rows of thin film transistors in the scanning region through multiple consecutive gate lines in the plurality of first scanning periods in a first sequential order, thereby forming a first linear scanning light source limited in the scanning region to scan the scanning region along a column direction;
    wherein controlling the light emitting layer to form the scanning light source in the second scanning mode comprises:
    simultaneously turning on multiple consecutive rows of thin film transistors in the scanning region through multiple consecutive gate lines; and
    controlling multiple consecutive data lines extending through the scanning region to transmit data signals to sources electrodes of multiple columns of thin film transistors in the scanning region in the plurality of second scanning periods in a second sequential order, thereby forming a second linear scanning light source limited in the scanning region to scan the scanning region along a row direction.

14. The method of claim 13, wherein the scanning pattern comprises linear scanning lines.

15. The method of claim 13, wherein the light emitting layer comprises:
    an array of a plurality of light emitting elements;
    a plurality of thin film transistors respectively driving light emission of the plurality of light emitting elements;
    a plurality of data lines; and
    a plurality of gate lines;
    wherein a respective one of the plurality of data lines is electrically connected to source electrodes of thin film transistors in a column of the plurality of thin film transistors;
    a respective one of the plurality of gate lines is electrically connected to gate electrodes of thin film transistors in a row of the plurality of thin film transistors; and
    drain electrodes of the plurality of thin film transistors are respectively electrically connected to the plurality of light emitting elements; and
    wherein the method further comprises turning on or off the plurality of thin film transistors respectively through the plurality of gate lines, and controlling transmission of data signals to the plurality of light emitting elements respectively through the plurality of data lines;
    wherein controlling the light emitting layer to form the scanning light source comprises:

controlling multiple consecutive data lines extending through the scanning region to simultaneously transmit data signals to sources electrodes of multiple columns of thin film transistors in the scanning region, and turning on multiple rows of thin film transistors in the scanning region through multiple consecutive gate lines in a first sequential order, thereby forming a first linear scanning light source limited in the scanning region to scan the scanning region along a column direction.

16. The method of claim 13, wherein the light emitting layer comprises:

an array of a plurality of light emitting elements;

a plurality of thin film transistors respectively driving light emission of the plurality of light emitting elements;

a plurality of data lines; and a plurality of gate lines;

wherein a respective one of the plurality of data lines is electrically connected to source electrodes of thin film transistors in a column of the plurality of thin film transistors;

a respective one of the plurality of gate lines is electrically connected to gate electrodes of thin film transistors in a row of the plurality of thin film transistors; and drain electrodes of the plurality of thin film transistors are respectively electrically connected to the plurality of light emitting elements;

wherein the method further comprises turning on or off the plurality of thin film transistors respectively through the plurality of gate lines, and controlling transmission of data signals to the plurality of light emitting elements respectively through the plurality of data lines;

wherein controlling the light emitting layer to form the scanning light source comprises:

simultaneously turning on multiple consecutive rows of thin film transistors in the scanning region through multiple consecutive gate lines; and controlling multiple consecutive data lines extending through the scanning region to transmit data signals to sources electrodes of multiple columns of thin film transistors in the scanning region in a second sequential order, thereby forming a second linear scanning light source limited in the scanning region to scan the scanning region along a row direction.

17. The method of claim 13, wherein the light emitting layer comprises:

an array of a plurality of light emitting elements;

a plurality of thin film transistors respectively driving light emission of the plurality of light emitting elements;

a plurality of data lines; and a plurality of gate lines;

wherein a respective one of the plurality of data lines is electrically connected to source electrodes of thin film transistors in a column of the plurality of thin film transistors;

a respective one of the plurality of gate lines is electrically connected to gate electrodes of thin film transistors in a row of the plurality of thin film transistors; and drain electrodes of the plurality of thin film transistors are respectively electrically connected to the plurality of light emitting elements;

wherein the method further comprises turning on or off the plurality of thin film transistors respectively through the plurality of gate lines, and controlling transmission of data signals to the plurality of light emitting elements respectively through the plurality of data lines;

wherein controlling the light emitting layer to form the scanning light source comprises:

controlling multiple light emitting elements limited in the scanning region to time-sequentially forming a plurality of point light sources consecutively arranged, one of the plurality of point light sources turning on at a time while a remainder of the plurality of point light sources turned off, thereby forming the scanning pattern comprising linear scanning lines;

wherein a respective one of the plurality of point light sources comprises one or multiple adjacent light emitting elements.

18. The method of claim 17, wherein the scanning pattern comprises a continuous folded line comprising a plurality of linear lines parallel to each other.

* * * * *